US011859118B2

(12) United States Patent
Qu et al.

(10) Patent No.: US 11,859,118 B2
(45) Date of Patent: Jan. 2, 2024

(54) CADMIUM-FREE QUANTUM DOTS, TUNABLE QUANTUM DOTS, QUANTUM DOT CONTAINING POLYMER, ARTICLES, FILMS, AND 3D STRUCTURE CONTAINING THEM AND METHODS OF MAKING AND USING THEM

(71) Applicant: TECTUS CORPORATION, Saratoga, CA (US)

(72) Inventors: Lianhua Qu, Pittsburgh, PA (US); Hunaid Nulwala, Pittsburgh, PA (US)

(73) Assignee: TECTUS CORPORATION, Saratoga, CA (US)

( * ) Notice: Subject to any disclaimer, the term of this patent is extended or adjusted under 35 U.S.C. 154(b) by 0 days.

(21) Appl. No.: 18/077,944

(22) Filed: Dec. 8, 2022

(65) Prior Publication Data
US 2023/0193130 A1 Jun. 22, 2023

Related U.S. Application Data

(62) Division of application No. 16/302,870, filed as application No. PCT/US2017/033630 on May 19, 2017, now abandoned.
(Continued)

(51) Int. Cl.
*C09K 11/02* (2006.01)
*C09K 11/62* (2006.01)
(Continued)

(52) U.S. Cl.
CPC ............ *C09K 11/883* (2013.01); *C09K 11/00* (2013.01); *C09K 11/025* (2013.01);
(Continued)

(58) Field of Classification Search
CPC ....... C09K 11/883; C09K 11/00; C09K 11/02; C09K 11/025; C09K 11/623; C09K 11/62;
(Continued)

(56) References Cited

U.S. PATENT DOCUMENTS 5,260,124 A 11/1993 Gaier
5,763,085 A 6/1998 Atarashi
(Continued)

FOREIGN PATENT DOCUMENTS

CN 102676174 A 9/2012
CN 105295921 A 2/2016
(Continued)

OTHER PUBLICATIONS

Park et al., "Highly Bright Yellow-Green Emitting CuInS2 Colloidal Quantum Dots with Core/Shell/Shell Architecture for White Light-Emitting Diodes", Mar. 10, 2015, ACS Appl. Mater. Interfaces, 7, pp. 6764-6771. (Year: 2015).*
(Continued)

*Primary Examiner* — Matthew E. Hoban
*Assistant Examiner* — Lynne Edmondson

(57) ABSTRACT

Quantum dots that are cadmium-free and/or stoichiometrically tuned are disclosed, as are methods of making them. Inclusion of the quantum dots and others in a stabilizing polymer matrix is also disclosed. The polymers are chosen for their strong binding affinity to the outer layers of the quantum dots such that the bond dissociation energy between the polymer material and the quantum dot is greater than the energy required to reach the melt temperature of the cross-linked polymer.

18 Claims, 13 Drawing Sheets

The valence and conduction bands of am- and γ-Al2O3 films grown by atomic layer deposition. The valence band maximum was found to be centered at 3.64 ± 0.04 eV for am-Al2O3 and 3.47 ± 0.04 eV for γ-Al2O3. The band gap of Al2O3 was determined to be 7.0 ± 0.1 and 7.6 ± 0.1 eV for measured am- and γ-Al2O3, respectively.

Related U.S. Application Data

(60) Provisional application No. 62/441,182, filed on Dec. 31, 2016, provisional application No. 62/338,915, filed on May 19, 2016, provisional application No. 62/338,888, filed on May 19, 2016.

(51) Int. Cl.

| | | |
|---|---|---|
| *C09K 11/64* | (2006.01) | |
| *C09K 11/08* | (2006.01) | |
| *C09K 11/88* | (2006.01) | |
| *H01L 33/50* | (2010.01) | |
| *H01L 33/24* | (2010.01) | |
| *H01L 33/06* | (2010.01) | |
| *H01L 33/00* | (2010.01) | |
| *C09K 11/00* | (2006.01) | |

(52) U.S. Cl.
CPC .......... *C09K 11/623* (2013.01); *C09K 11/642* (2013.01); *H01L 33/00* (2013.01); *H01L 33/06* (2013.01); *H01L 33/24* (2013.01); *H01L 33/502* (2013.01)

(58) Field of Classification Search
CPC .. C09K 11/642; C09K 11/0811; H01L 33/502
See application file for complete search history.

(56) References Cited

U.S. PATENT DOCUMENTS

| | | | |
|---|---|---|---|
| 5,958,591 | A | 9/1999 | Budd |
| 6,057,396 | A | 5/2000 | Lan |
| 6,207,280 | B1 | 3/2001 | Atarashi |
| 6,322,901 | B1 | 11/2001 | Bawendi |
| 6,423,551 | B1 | 7/2002 | Weiss |
| 6,602,671 | B1 | 8/2003 | Bawendi |
| 6,607,829 | B1 | 8/2003 | Bawendi |
| 6,699,723 | B1 | 3/2004 | Weiss |
| 6,815,064 | B2 | 11/2004 | Treadway |
| 6,819,845 | B2 | 11/2004 | Lee |
| 6,821,337 | B2 | 11/2004 | Bawendi |
| 6,861,155 | B2 | 3/2005 | Bawendi |
| 6,927,069 | B2 | 8/2005 | Weiss |
| 7,056,471 | B1 | 6/2006 | Han |
| 7,125,605 | B2 | 10/2006 | Bawendi |
| 7,138,098 | B2 | 11/2006 | Bawendi |
| 7,229,690 | B2 | 6/2007 | Chan |
| 7,358,101 | B2 | 4/2008 | Yang |
| 7,358,525 | B2 | 4/2008 | Lee |
| 7,611,750 | B2 | 11/2009 | Yi |
| 7,768,032 | B2 | 8/2010 | Makihara |
| 7,777,233 | B2 | 8/2010 | Kahen |
| 7,825,405 | B2 | 11/2010 | Kim |
| 7,842,385 | B2 | 11/2010 | Jang |
| 7,867,557 | B2 | 1/2011 | Pickett |
| 7,981,667 | B2 | 7/2011 | Nie |
| 7,986,018 | B2 | 7/2011 | Rennie |
| 8,017,235 | B2 | 9/2011 | Nakamura |
| 8,101,258 | B2 | 1/2012 | Hahn |
| 8,106,292 | B2 | 1/2012 | Cumpston |
| 8,262,998 | B2 | 9/2012 | Vlahovic |
| 8,343,575 | B2 | 1/2013 | Dubrow |
| 8,368,106 | B2 | 2/2013 | Jang |
| 8,414,800 | B2 | 4/2013 | Jang |
| 8,454,927 | B2 | 6/2013 | Qu |
| 8,536,776 | B2 | 9/2013 | Wood |
| 8,784,703 | B2 | 7/2014 | Kahen |
| 8,847,197 | B2 | 9/2014 | Pickett |
| 8,945,421 | B2 | 2/2015 | Lee |
| 8,981,305 | B2 | 3/2015 | Holloway |
| 9,023,659 | B2 | 5/2015 | Aimiya |
| 9,054,329 | B2 | 6/2015 | Coe-Sullivan |
| 9,199,842 | B2 | 12/2015 | Dubrow |
| 9,205,420 | B2 | 12/2015 | Reece |
| 9,425,253 | B2 | 8/2016 | Qu |
| 9,570,549 | B2 | 2/2017 | Jang |
| 10,995,267 | B2 | 5/2021 | Bootman |
| 2001/0023078 | A1 | 9/2001 | Bawendi |
| 2006/0014315 | A1 | 1/2006 | Chan |
| 2006/0028882 | A1 | 2/2006 | Qu |
| 2006/0036084 | A1 | 2/2006 | Qu |
| 2006/0040103 | A1 | 2/2006 | Whiteford |
| 2007/0087197 | A1 | 4/2007 | Jang |
| 2007/0111324 | A1 | 5/2007 | Nie |
| 2007/0125984 | A1 | 6/2007 | Tian |
| 2007/0200479 | A1 | 8/2007 | Jean |
| 2008/0202383 | A1 | 8/2008 | Shi |
| 2008/0280161 | A1 | 11/2008 | Jang |
| 2008/0296534 | A1 | 12/2008 | Lifshitz |
| 2008/0311182 | A1 | 12/2008 | Ferrari |
| 2009/0116753 | A1 | 5/2009 | Midgley |
| 2009/0169866 | A1 | 7/2009 | Ostafin |
| 2009/0202814 | A1 | 8/2009 | Jabado |
| 2009/0321692 | A1 | 12/2009 | Locascio |
| 2010/0051901 | A1 | 3/2010 | Kazlas |
| 2010/0140586 | A1 | 6/2010 | Char |
| 2010/0167011 | A1 | 7/2010 | Dubrow |
| 2010/0252778 | A1 | 10/2010 | Murase |
| 2010/0264371 | A1 | 10/2010 | Nick |
| 2010/0289003 | A1 | 11/2010 | Kahen |
| 2011/0021970 | A1 | 1/2011 | Vo-Dinh |
| 2011/0084250 | A1 | 4/2011 | Jang |
| 2011/0203650 | A1 | 8/2011 | Furusawa |
| 2011/0233468 | A1 | 9/2011 | Zong |
| 2012/0061627 | A1 | 3/2012 | Reiss |
| 2013/0011339 | A1 | 1/2013 | Colvin |
| 2013/0295586 | A1 | 11/2013 | Bartel |
| 2014/0001405 | A1 | 1/2014 | Guo |
| 2014/0005083 | A1 | 1/2014 | Malshe |
| 2014/0045323 | A1 | 2/2014 | Gonen Williams |
| 2014/0140918 | A1 | 5/2014 | Breen |
| 2014/0252316 | A1 | 9/2014 | Yan |
| 2014/0264196 | A1* | 9/2014 | Werner .................. C23C 16/30 977/774 |
| 2014/0319433 | A1 | 10/2014 | Pickett |
| 2014/0339497 | A1 | 11/2014 | Qu |
| 2015/0268370 | A1 | 9/2015 | Johnston |
| 2015/0344776 | A1 | 12/2015 | Bootman |
| 2017/0045524 | A1 | 2/2017 | Qu |
| 2017/0137710 | A1 | 5/2017 | Miyanaga |
| 2019/0177615 | A1 | 6/2019 | Qu |

FOREIGN PATENT DOCUMENTS

| | | | |
|---|---|---|---|
| EP | 1790686 | A2 | 5/2007 |
| EP | 2184333 | A2 | 5/2010 |
| EP | 3148712 | A1 | 4/2017 |
| EP | 3561514 | A1 | 10/2019 |
| JP | 2010535692 | A | 11/2010 |
| WO | 2005001889 | A2 | 1/2005 |
| WO | 2006051153 | A2 | 5/2006 |
| WO | 2006134599 | A1 | 12/2006 |
| WO | 2008140495 | A2 | 11/2008 |
| WO | 2009020436 | A1 | 2/2009 |
| WO | 2009026396 | A1 | 2/2009 |
| WO | 2009035657 | A1 | 3/2009 |
| WO | 2011038111 | A1 | 3/2011 |
| WO | 2013039897 | A2 | 3/2013 |
| WO | 2013114254 | A2 | 8/2013 |
| WO | 2013191655 | A1 | 12/2013 |
| WO | 2015156226 | A1 | 10/2015 |
| WO | 2015184329 | A1 | 12/2015 |

OTHER PUBLICATIONS

A Shahravan, T Desai, T Matsoukas. "Passivation of Aluminum Nanoparticles by Plasma-Enhanced Chemical Vapor Deposition for Energetic Nanomaterials." Applied Materials & Interfaces, vol. 6, 2014, pp. 7942-7947. (Year: 2014).

Alivisatos, "Perspectives on the Physical Chemistry of Semiconductor Nanocrystals," J. Phys. Chem. (Aug. 1, 1996), 100(31): 13226-13239.

(56) References Cited

OTHER PUBLICATIONS

Barik et al., "Alumina Capped ZnO Quantum Dots Multilayer Grown by Pulsed Laser Deposition," Solid State Communications, 2003, 127: 463-467.
Carevic etal., "The influence of reaction media on CdIn2S4 and ZnIn2S4 nanocrystallite formation and growth of mescocrystal structures", CrystEngComm 2015, 17, Royal Society of Chemistry, pp. 8492-8499. (Year: 2015).
Chen et al., "Zn0/Al203 core-shell nanorod arrays: growth, structural, characterization, and uminescent properties," Nanotechnology IOP, Bristol, GB (May 6, 2009), 20(18): 185605.
Dave et al.: "Monodisperse magnetic nanoparticles for biodetection, imaging, and drug delivery: a versatile and evolving technology",Wiley Interdisciplinary Reviews: Nanomedicine and Nanobiotechnology, vol. 1, No. 6, Nov. 1, 2009 (Nov. 1, 2009), pp. 583-609.
David Valdesueiro etal. "Deposition Mechanism of Aluminum Oxide on Quantum Dot Films at Atmospheric Pressure and Room Temperature." The Journal of Physical Chemistry C, vol. 120, 2016, pp. 4266-4275. (Year: 2016).
Extended European Search Report for EP 15798955.9 dated Jan. 4, 2018.
Extended European Search Report for EP 19163854.3 dated Sep. 17, 2019.
Extended European Search Report issued on European Patent Application No. 10819454.9 dated Feb. 26, 2016.
Eychmuller, Structure and Photophysics of Semiconductor Nanocrystals, J. Phys. Chem. B, (Jun. 21, 2000), 32:104(28):6514-6528.
Filikhin et al., "Electronic and level statistics properties of Si/SiO2 quantum dots," Physica E 42 (2010) pp. 1979-1983.
Guo et al., "Energy transfer between colloidal semiconductor nanocrystals in an optical microcavity," Applied Physics Letters 89 (2006) 061104.
Harrison et al., "Investigation of Factors Affecting the Photoluminescence of Colloidally-Prepared HgTe Nanocrystals," J. Mater. Chem. (1999), 9:2721-2722.
Hines et al., Synthesis and Characterization of Strongly Luminescing ZnS-Capped CdSe Nanocrystals, Jan. 1996, J. Phys. Chem. 100(2):468-471 (Abstract).
International Search Report and Written Opinion dated Aug. 5, 2015 for PCT/US2015/033288.
Kanemitsu et al., Excitions in silicon quantum structures, Journal of Luminescence, (1999), 83-84:283-290.
Kim et al., "Enhanced Performance of Al2O3 Coated ZnO Nanorods in CdS/CdSe Quantum Dot-Sensitized Solar Dell," Materials Chemistry and Physics, (2014) 143:1404-1409.
Korgel et al, "Controlled Synthesis of Mixed Core and Layered (Zn, Cd)S and (Hg,Cd)S Nanocrystals Within Phosphatidylcholine Vesicles," Langmuir (Mar. 11, 2000), 16(8):3588-3594.
Lambert et al, "Embedding Quantum Dot Monolayers in Al2O3 Using Atomic Layer Deposition," Chem. of Materials (2011), 23:126-128.
Law, et al., "ZnO-Al2O3 and ZnO-TIO2 Core-Shell Nanowire Dye-Sensitized Solar Cells," J. Phys. Chem, B. Materials, Survaces, Interfaces and Biophysical, Washington DC, US (Nov. 16, 2006), 110(45):22652-22663.
Lowe. "In The Pipeline—Trimethylaluminum Explosion in Massachusetts." http://blogs.sciencemag.org/pipeline/archives/2016/01/07/trimethylaluminum-explosion-in-massachusetts accessed Feb. 7, 2019, published Jan. 7, 2016, 15 pages.
McBride et al., "Structural Basis for Near Unity Quantum Yield Core/Shell Nanostructures", Nano Letters, 2006, / vol. 6, No. 7, 1496-1501.
MDPA Del-Valle, HDJ Cruz-Manjarrez, A Rodriguez-Gomez. "Simple Fabrication and Characterization of an Aluminum Nanoparticle Monolayer with Well-Defined Plasmonic Resonances in the Far Ultraviolet." Metals, vol. 8 (67), 2018, pp. 1-14. ( Year: 2018).
Micic et al., Size Dependent Spectroscopy of InP Quantum Dots, J. Phys. Chem. B, (Jun. 19, 1997)101 (25):4904-4912.
Mohamed et al., "Improved Luminescence Properties and Thermal Stability of ZnS Quantum Dots by Organic and horganic Passivation," Chinese Physics Letters 19 (2002) pp. 967-969.
Murray, et al., Synthesis and Characterization of Nearly Monodisperse CdE (E=S, Se, Te) Semiconductor Nanoncrystallites, 1993, J. Am. Chem. Soc. 115(19):8706-8715.
Nirmal et al., "Luminescence Photphysics in Semiconductor Nanocrystals," Acc. Chem. Res. (Nov. 25, 1999), 32(5):407-414.
Panigrahi et al, "ZnO-SiO2 core-shell nanorod composite: Microstructure, emission and photoconductivity properties," Chemical Physics Letters 511 (2011), 91-96.
PCT/US2012/043349 International Search Report dated Oct. 29, 2012.
Pourret et al., "Atomic Layer Deposition of ZnO in Quantum Dot Thin Films," Advanced Materials (2009), 21:232-235.
Rosenthal et al., Biocompatible Quantum Dots for Biological Applications, Chemistry & Biology (Jan. 28, 2011), 18(1) pp. 10-24.
Selvan et al., "Silica-coated Quantum Dots and Magnetic Nanoparticles for Bioimaging Applications," Bio interphases 5(2010) pp. FA110-FA115.
Shuhendler et al., Hybrid Quantum Dot—Fatty Ester Stealth Nanoparticles: Toward Clinically Relevant in Vivo Optical Imaging of Deep Tissue, ACS Nano (2011), 5(3) pp. 1958-1966.
Supplementary European Search Report for EP 12801910 dated Nov. 12, 2014.
Talapin et al., A Novel Organometallic Synthesis of Hihgly Luminescent CdTe Nanocrystals, J. Phys. Chem. B, (Mar. 22, 2001), 105(12):2260-2263.
TJ Foley, CE Johnson, KT Higa. "Inhibition of Oxide Formation on Aluminum Nanoparticles by Transition Metal Coating." Chemistry of Materials, vol. 17, 2005, pp. 4086-4091. (Year: 2005).
Van Hemmen et al., Plasma and Thermal ALD of Al2O3 in a Commercial 200 mm ALD Reactor, Journal of the Electrochemical Society, (2007), 154(7):G165-G169.
Veprek, "Electronic and mechanical properties of nanocrystalline composites when approaching molecular size," Thin Solid Films (1997), 145-153.
Wu et al.: "Immunofluorescent labeling of cancer marker Her2 and other cellular targets with semiconductor quantum dots", Nature Biotechnology, vol. 21, No. 1, Dec. 2, 2002 (Dec. 2, 2002), pp. 41-46.
Xu et al., "Quantum Dots Confined in Nanoporus Alunina Membranes," Applied Physics Letters (2006), 89:133110-1 to 133110-3.
Zhichun Li, Wei Yao, Long Kong, Yixin Zhao, and Liang Li. "General Method for the Synthesis of Ultrastable Core/Shell Quantum Dots by Aluminum Doping." Journal of the American Chemical Society, vol. 137, 2015, pp. 12430-12433. (Year: 2015).

\* cited by examiner

| Time (hrs) | Intensity (a.u.) CdSe/ZnS in polymer | Intensity (a.u.) CdSe/ZnS/Al2O3 in polymer |
|---|---|---|
| 0 | 100 | 150 |
| 1 | 102 | 158 |
| 3 | 104 | 158 |
| 22 | 100 | 150 |
| 46 | 105 | 148 |
| 72 | 101 | 153 |
| 96 | 100 | 155 |

Schematics on (a) a type-I bandgap configuration and (b) type-II bandgap configurations of core/shell QDs. The type-I bandgap configuration increases the probability of electron and hole wavefunction confinement to the core, improving the recombination probability.

The valence and conduction bands of am- and γ-Al2O3 films grown by atomic layer deposition. The valence band maximum was found to be centered at 3.64 ± 0.04 eV for am-Al2O3 and 3.47 ± 0.04 eV for γ-Al2O3. The band gap of Al2O3 was determined to be 7.0 ± 0.1 and 7.6 ± 0.1 eV for measured am- and γ-Al2O3, respectively.

| Time (hrs) | Intensity (a.u.) CdSe/ZnS | Intensity (a.u.) CdSe/ZnS/Al2O3 |
|---|---|---|
| 0 | 100 | 150 |
| 1 | 102 | 158 |
| 3 | 104 | 158 |
| 22 | 100 | 150 |
| 46 | 105 | 148 |
| 72 | 101 | 153 |
| 96 | 100 | 155 |

| Time (hrs) | Intensity (a.u.) CdSe/ZnS in Polymer | Intensity (a.u.) CdSe/ZnS/Al2O3 in Polymer |
|---|---|---|
| 0 | 100 | 150 |
| 1 | 102 | 158 |
| 3 | 104 | 158 |
| 22 | 100 | 150 |
| 46 | 105 | 148 |
| 72 | 101 | 153 |
| 96 | 100 | 155 |

CADMIUM-FREE QUANTUM DOTS, TUNABLE QUANTUM DOTS, QUANTUM DOT CONTAINING POLYMER, ARTICLES, FILMS, AND 3D STRUCTURE CONTAINING THEM AND METHODS OF MAKING AND USING THEM

CROSS-REFERENCE TO RELATED APPLICATIONS

This application is a divisional of U.S. application Ser. No. 16/302,870, filed on Nov. 19, 2018, now allowed, which is a national phase filing under 35 U.S.C. § 371 of PCT International Application No. PCT/US2017/033630 filed on May 19, 2017, which claims the benefit under 35 U.S.C. § 119(e) of U.S. Provisional Application No. 62/338,888 filed on May 19, 2016; U.S. Provisional Application No. 62/338,915 filed on May 19, 2016; and U.S. Provisional Application No. 62/441,182 filed on Dec. 31, 2016, each of which is incorporated by reference in its entirety.

FIELD

This disclosure relates to the field of quantum dots, polymers containing quantum dots, methods of making the quantum dots and polymers containing them as well as methods of using them.

BACKGROUND

Much research has been devoted to improving the stability and useable life of quantum dots and their ease of manufacture and use. Applicants have developed several techniques and quantum dots that each contribute to improved stability, ease of manufacture, and/or ease of use.

Nie (U.S. Pat. Nos. 7,981,667 and 84,201,550) and Qu (U.S. Pat. No. 8,454,927), each of which is hereby incorporated by reference in its entirety, disclose methods of making quantum dots that are tunable by stoichiometry, rather than by size. Particularly, alloy-gradient quantum dots disclosed therein are particularly stable. These quantum dots are more stable than predecessor dots, benefit from ease of manufacture—since split second timing is no longer required to obtain the right size and therefore the desired emission wavelength. These quantum dots further benefit from uniform size, regardless of emission wavelength, which allows for uniform handling and processing, which is not possible with size-tunable quantum dots, which require different sized quantum dots to achieve a spectrum of colors.

These stoichiometrically-tuned quantum dots were further stabilized by capping, in some instances with ZnS, resulting in a capped alloy-gradient stoichiometrically tuned quantum dot.

While this advance was, and remains, a significant advance in quantum dot science, further improvements to stability were sought. Particularly, quantum dots are sensitive to their immediate, proximate environment. Applicants found by passivating the surface of the quantum dot, particularly with atomic layers of $Al_2O_3$, stability improved tremendously. The passivation layer essentially places an optically neutral layer of armor around the quantum dot, making it incredibly stable. Combining the advances of the Nie (U.S. Pat. Nos. 7,981,667 and 84,201,550 and Qu (U.S. Pat. No. 8,454,927) disclosures with the passivation produces a stable, long-lived, uniformly sized quantum dot. These concepts are captured in applicants' U.S. Pat. No. 9,425,253, hereby incorporated by reference.

Although incredibly stable, well-performing, and long-lived, these passivated quantum dots are still difficult to handle and process, and still sensitive to their immediate, proximate environment and could benefit from a stable electronic environment immediately proximate their outer surface (e.g. outside the passivation layer). Accordingly, more, better, and/or different ways of stabilizing quantum dots, regardless of type, particularly for optoelectronic applications is desired.

Further, additional method of making the quantum dots, themselves, are always sought after.

Applicants have now discovered that by tightly bonding a polymer to the outer surface of the quantum dot, stability of the quantum dot can be maintained even in a variety of harsh manufacturing conditions, such as, but not limited to, extrusion molding, injection molding, and other techniques.

As described further below, in particular embodiments, the polymer is chosen such that it cross-links with the passivation layer (e.g. $Al_2O_3$) of the quantum dot such that the bond dissociation energy associated with the polymer/passivation layer is greater than the energy needed to melt the cross-linked polymer. In other words, the bond between the polymer and the passivation layer is not broken at extrusion (or other manufacturing) temperatures. This tight bond essentially protects the quantum dot during melting operations such as extrusion and injection molding. Previously, quantum dots exposed to such temperatures simply went dark, their optoelectronic properties extinguished by the processing conditions.

Described herein are methods for making quantum dot-containing polymer resins and the polymer resins themselves. These methods are applicable to various types of quantum dots provided the polymer can tightly bond to the surface of the quantum dot.

SUMMARY

Some embodiments provide a method for synthesizing II-VI-VI semiconductor nanocrystals (SCNs) of the formula $WY_xZ_{(1-x)}$ having a predetermined emission wavelength, wherein W is a Group II element, Y and Z are different Group VI elements, and $0<X<1$, comprising heating a II-VI-VI SCN precursor solution to a temperature sufficient to produce the II-VI-VI SCNs, wherein the II-VI-VI SCN precursor solution comprises a Group II element, a first Group VI element, a second Group VI element, and a pH controller in one or more solvents together comprising one or more $C_{12}$ to $C_{20}$ hydrocarbons and one or more fatty acids; and wherein the amount of pH controller is adjusted to provide the predetermined emission wavelength from the SCNs.

In some embodiments, the Group II element is one or more selected from Cd. Zn and Hg.

In some embodiments, each of the first Group VI element and the second Group VI element is one or more selected from S, Se, Te, Po, and O.

In some embodiments the $C_{12}$, to $C_{20}$ hydrocarbons are one or more selected from hexadecene, octadecene, eicosene, hexadecane, octadecane and Icosane.

In some embodiments, the fatty acids are one or more selected from myristoleic acid, palmitoleic acid, sapienic acid, oleic acid, elaidic acid, vaccenic acid, linoleic acid, linoelaidic acid, α-Linolenic acid, arachidonic acid, eicosapentaenoic acid, erucic acid, docosahexaenoic acid, stearic acid, palmitic acid, and arachidic acid.

In some embodiments, the pH controller is an oxide or carboxylic acid salt of a Group II element.

In some embodiments, pH controller is selected from zinc salts of acetic acid, citric acid, lactic acid, propionic acid, butyric acid, tartaric acid, and valeric acid.

In some embodiments, the II-VI-VI SCN precursor solution is prepared by: dissolving the Group II element, the first Group VI element, and the second Group VI element in a solvent comprising the pH controller, octadecene and a fatty acid to provide the II-VI-VI SCN precursor solution.

In some embodiments, the II-VI-VI SCN precursor is prepared by preparing a first solution by dissolving the Group II element and the first Group VI element in a first solvent comprising octadecene and a fatty acid; preparing a second solution by dissolving the second Group VI element in a second solvent comprising octadecene; mixing the first and second solutions to provide a II-VI-VI SCN precursor solution; adding the pH controller to one or both of the first and second.

In some embodiments, the II-VI-VI SCN precursor solution is prepared by preparing a first solution by dissolving a Group II element in a first solvent comprising octadecene and a fatty acid; preparing a second solution by dissolving a first Group VI and a second Group VI element in a second solvent comprising octadecene; adding the pH controller to one or both of the first and second solutions; and mixing said first and second solutions to provide a II-VI-VI SCN precursor solution.

In some embodiments, the II-VI-VI SCN precursor is prepared by: preparing a first solution by dissolving a Group II element in a first solvent comprising octadecene and a fatty acid; preparing a second solution by dissolving a first Group VI element in a second solvent comprising octadecene; preparing a third solution by dissolving a second. Group VI element in a third solvent comprising tributylphosphine; adding the pH controller to one or more of the first, second, or third solutions; and mixing the first, second, and third solutions to provide all-VI-VI SCN precursor solution.

In some embodiments, the fatty acid is oleic acid.

In some embodiments, the temperature is between about 270° C. and 330° C.

Some embodiments provide a II-VI-VI semiconductor nanocrystals made according to the methods disclosed herein.

Some embodiments provide a II-VI-VI semiconductor nanocrystal comprising Cd, S and Se, where in the nanocrystal has been modified by a zinc alkylcarboxylate pH controller.

Some embodiments provide a method of tuning a II-VI-VI semiconductor nanocrystal of known emission wavelength, the method comprising: providing a II-VI-VI semiconductor nanocrystal having a known emission wavelength; heating the semiconductor nanocrystal in a solution comprising a pH controller, one or more $C_{12}$ to $C_{20}$ hydrocarbons and one or more fatty acids to form an SCN solution; adding a solution comprising dialkyl zinc, hexaalkyldisilathiane and trialkylphosphine; and heating to a temperature sufficient to produce a capped II-VI-VI semiconductor nanocrystal; wherein the amount of pH controller is adjusted to provide a predetermined emission wavelength shift from the known emission wavelength of the II-VI-VI semiconductor nanocrystal.

In some embodiments, the $C_{12}$ to $C_{20}$ hydrocarbons are one or more selected from hexadecene, octadecene, eicosene, hexadecane, octadecane and Icosane.

In some embodiments, the fatty acids are one or more selected from myristoleic acid, palmitoleic acid, sapienic acid, oleic acid, elaidic acid, vaccenic acid, linoleic acid, linoelaidic acid, α-Linolenic acid, arachidonic acid, eicosapentaenoic acid, erucic acid, docosahexaenoic acid, stearic acid, palmitic acid, and arachidic acid.

In some embodiments, the pH controller is an oxide or carboxylic acid salt of a Group II element.

In some embodiments, pH controller is selected from zinc salts of acetic acid, citric acid, lactic acid, propionic acid, butyric acid, tartaric acid, and valeric acid.

In some embodiments, the dialkyl zinc is dimethyl zinc, the hexaalkyldisilathiane is hexamethyldisilathiane and the trialkylphosphine is trioctylphosphine.

In some embodiments, the temperature is between about 150° C. and 350° C.

Some embodiments provide a tuned II-VI-VI semiconductor nanocrystal made according to the methods disclosed herein.

Some embodiments provide a capped II-VI-VI semiconductor nanocrystal comprising: a core comprising a II-VI-VI semiconductor nanocrystal comprising Cd, S and Se, wherein the nanocrystal has been modified by a zinc alkylcarboxylate; and a cap layer selected from the group consisting of a layer comprising ZnS, a layer comprising $Al_2O_3$, and a multi-layer cap comprising a first layer comprising ZnS and a second layer comprising $Al_2O_3$.

Some embodiments provide a cadmium free "Cd-free" semiconductor nanocrystal comprising one or more group II elements, one or more group III elements, and one or more group VI elements, wherein the semiconductor nanocrystal is substantially free of cadmium.

In some embodiments, the semiconductor nanocrystal does not contain cadmium.

In some embodiments, the Cd-free nanocrystal have an emission wavelength in the near ultraviolet to far infrared range.

Some embodiments provide a method for synthesizing Cd-free semiconductor nanocrystals comprising: heating a precursor solution comprising one or more non-cadmium Group II elements, one or more Group III elements and one or more Group VI elements in one or more solvents together comprising one or more $C_{12}$ to $C_{20}$ hydrocarbons, one or more fatty acids and optionally one or more $C_1$ to $C_{22}$ alkyl thiols to a temperature sufficient to produce the Cd-free semiconductor nanocrystals.

In some embodiments, the Group II elements are one or more selected from Cu, Zn and Hg.

In some embodiments, the Group III elements are one or more selected from In, Ga, Al, and Tl.

In some embodiments, the Group VI elements are one or more selected from S, Se, Te, Po, and O.

In some embodiments, the $C_{12}$ to $C_{20}$ hydrocarbons are one or more selected from hexadecene, octadecene, eicosene, hexadecane, octadecane and Icosane.

In some embodiments, the fatty acids are one or more selected from myristoleic acid, palmitoleic acid, sapienic acid, oleic acid, elaidic acid, vaccenic acid, linoleic acid, linoelaidic acid, α-Linolenic acid, arachidonic acid, eicosapentaenoic acid, erucic acid, docosahexaenoic acid, stearic acid, palmitic acid, and arachidic acid.

In some embodiments, the fatty acid is oleic acid.

In some embodiments, the temperature is between about 270° C. and 330° C.

Some embodiments provide a Cd-free semiconductor nanocrystals made according to the methods disclosed herein.

Some embodiments provide a Cd-free semiconductor nanocrystal that has been modified by a zinc alkylcarboxylate.

Some embodiments provide a method of capping a Cd-free semiconductor nanocrystal comprising: providing a Cd-free semiconductor nanocrystal; heating the Cd-free semiconductor nanocrystal in a solution comprising one or more $C_{12}$ to $C_{20}$ hydrocarbons and one or more fatty acids to form an SCN solution: adding a solution comprising dialkyl zinc, hexaalkyldisilathiane and trialkylphosphine; and heating to a temperature sufficient to produce a capped Cd-free semiconductor nanocrystal.

In some embodiments, the $C_{17}$ to $C_{20}$ hydrocarbons are one or more selected from hexadecene, octadecene, eicosene, hexadecane, octadecane and Icosane.

In some embodiments, the fatty acids are one or more selected from myristoleic acid, palmitoleic acid, sapienic acid, oleic acid, elaidic acid, vaccenic acid, linoleic acid, linoelaidic acid, α-Linolenic acid, arachidonic acid, eicosapentaenoic acid, erucic acid, docosahexaenoic acid, stearic acid, palmitic acid, and arachidic acid.

In some embodiments, the dialkyl zinc is dimethyl zinc, the hexaalkyldisilathiane is hexamethyldisilathiane and the trialkylphosphine is trioctylphosphine.

In some embodiments, the temperature is between about 150° C. and 350° C.

Some embodiments provide a capped Cd-free semiconductor nanocrystal comprising: a core comprising a Cd-free semiconductor nanocrystal comprising a core of one or more group II elements, one or more group III elements, and one or more group VI elements, wherein the semiconductor nanocrystal is substantially free of cadmium, wherein the nanocrystal has been modified by a zinc alkylcarboxylate; a cap layer selected from the group consisting of a layer comprising ZnS; and a layer comprising $Al_2O_3$.

Some embodiments provide a quantum dot-containing polymer resin comprising: a plurality of quantum dots, each having an outermost layer; a polymer material cross-linked to the outermost layer such that the bond dissociation energy between the polymer material and the outermost layer is greater than the energy required to reach the melt temperature of the cross-linked polymer.

In some embodiments, the plurality of quantum dots are selected from core-shell quantum dots, Cd-free quantum dots, or stoichiometrically tuned quantum dots.

In some embodiments, the outermost layer is selected from a capping layer and a passivation layer.

In some embodiments, the outermost layer is a Zns capping layer.

In some embodiments, the outermost layer is an Al2O3 passivation layer.

In some embodiments, the polymer material is an acrylate resin comprising: units derived from polymerizing one or monomers according to the formula:

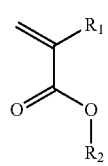

wherein $R_1$ is hydrogen or methyl and $R_2$ is selected from the group consisting of methyl; ethyl; propyl; isopropyl; butyl; isobutyl; pentyl; cyclopentyl; isopentyl; linear, branched and cyclic hexyl; linear, branched and cyclic heptyl; and linear branched and cyclic octyl.

In some embodiments, the acrylate resin further comprises units derived from polymerizing one or monomers according to the formula:

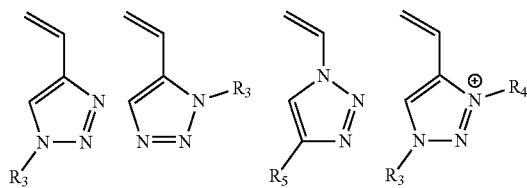

wherein each of $R_3$ and $R_4$ are independently selected from the group consisting of methyl; ethyl; propyl; isopropyl; butyl; isobutyl; pentyl; cyclopentyl; isopentyl; $C_6$ to $C_{12}$ linear, branched, cyclic and aromatic hydrocarbyl, and polyethylene glycol; and wherein $R_5$ is selected from the group consisting of hydrogen; methyl; ethyl; propyl; isopropyl; butyl; isobutyl; pentyl; cyclopentyl; isopentyl; $C_6$ to $C_{12}$ linear, branched, cyclic and aromatic hydrocarbyl, and polyethylene glycol.

Some embodiments provide a quantum dot containing polymer resin comprising a plurality of quantum dots each having an $Al_2O_3$ passivation layer; a polymer material cross-linked to the $Al_2O_3$ passivation layer, wherein the bond dissociation energy between the polymer material and the $Al_2O_3$ is greater than the energy required to reach the melt temperature of the cross-linked polymer.

Some embodiments provide a quantum dot-containing polymer resin comprising: a homogenous plurality of multi-color, same-sized alloy-gradient quantum dots each having a ZnS capping layer and an $Al_2O_3$ passivation layer; a polymer material cross-linked to the $Al_2O_3$ passivation layer, wherein the bond dissociation energy between the polymer material and the $Al_2O_3$ is greater than the energy required to reach the melt temperature of the cross-linked polymer.

Some embodiments provide a quantum dot containing polymer resin comprising: a plurality of quantum dots each having a ZnS capping layer and an $Al_2O_3$ passivation layer; a polymer material cross-linked to the $Al_2O_3$ passivation layer, wherein the bond dissociation energy between the polymer material and the $Al_2O_3$ is greater than the energy required to reach the inch temperature of the cross-linked polymer.

Some embodiments provide an article comprising at least one of a film, a multi-layer film, or a 3D object comprising a quantum dot-containing polymer, wherein polymer is bound to the quantum-dot such that the bond dissociation energy between the polymer material and the quantum dot is greater than the energy required to reach the melt temperature of the cross-linked polymer.

In some embodiments, the quantum dot-containing polymer is suitable for traditional polymer handling and manufacturing techniques, including but limited to solvent casting, injection molding, extrusion molding, etc.

Embodiments relate to semiconductor nanocrystals that can be tuned to pre-determined emission wavelengths.

In particular embodiments, the nanocrystalline particles have an emission wavelength in the near ultraviolet (UV) to far infrared (IR) range, and in particular, the visible range. More particularly, the quantum dots have an emission wavelength that can be from about 350 to about 750 nm.

Some embodiments provide quantum dot cores and semiconductor nanocrystals that have been modified by a zinc alkylcarboxylate such as zinc acetate.

Additional embodiments provide a method for synthesizing semiconductor core/shell nanoparticles that includes synthesizing a Cd-free semiconductor nanocrystal as described above, and coating it with a semiconductor shell with higher bandgap to improve the quantum efficiency and stability compared with the Cd-free semiconductor nanocrystals by itself.

Further embodiments provide a method for synthesizing a Cd-free semiconductor nanocrystal having a semiconductor shell as described above and a second shell that acts as an insulator.

Still further embodiments relate to films and 3-D structures that include and of the semiconductor nanocrystals, core/shell and core/shell/shell particles described herein dispersed in a acrylate resin. The films and 3-D structures provide the ability to cast films and 3-D structures on commercially applicable equipment resulting in highly stable quantum dot-polymer composite films and 3-D structures. The films and 3-D structures can be used in display and lighting applications. In particular aspects, a single-coat down-conversion film (SCDF) that includes a single layer of the quantum dot—polymer composite film, sandwiched between at least two transparent films and 3-D structures can be used. The single and multilayer inventive films and 3-D structures enable a simpler and more cost effective product that provides at least the performance of more complicated structures.

DETAILED DESCRIPTION

Figure 1:
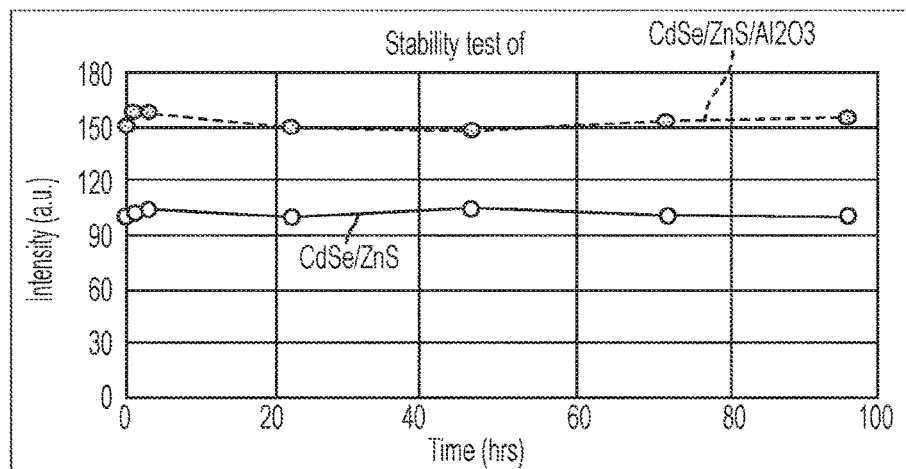
FIG. 1 is a schematic showing a type-I bandgap configuration and type-II bandgap configurations of core/shell QDs.
Figure 1:
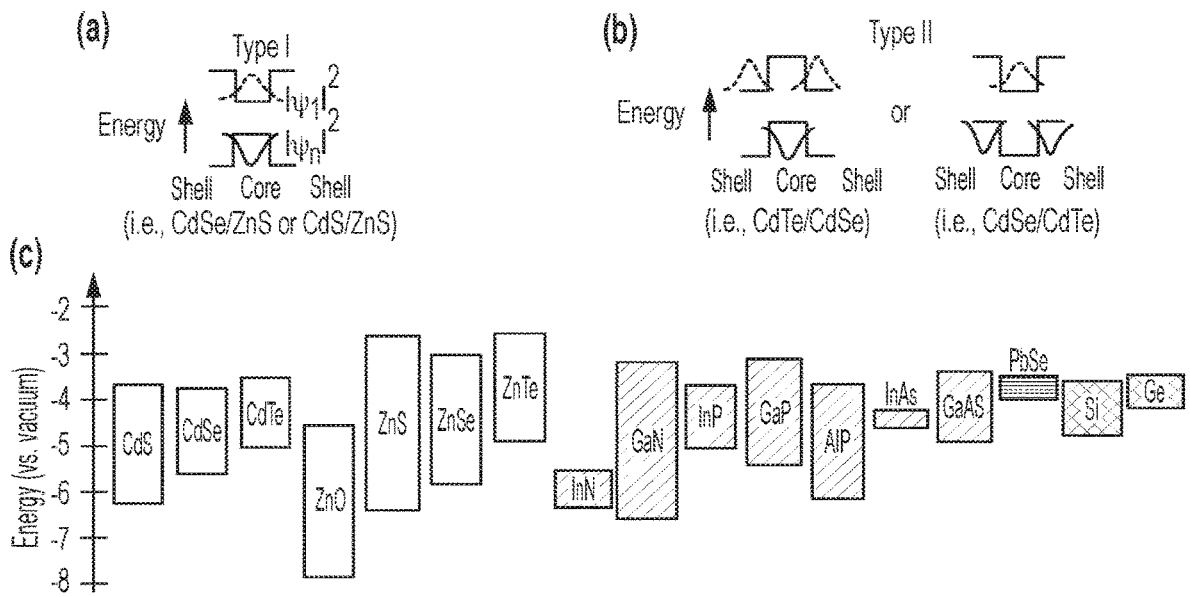

Applicants have now discovered that by tightly bonding a polymer to the outer surface of the quantum dot, stability of the quantum dot can be maintained even in a variety of harsh manufacturing conditions, such as, but not limited to, extrusion molding, injection molding, and other techniques.

As described further below, in particular embodiments, the polymer is chosen such that it cross-links with the passivation layer (e.g. $Al_2O_3$) of the quantum dot such that the bond dissociation energy associated with the polymer/passivation layer is greater than the energy needed to melt the cross-linked polymer. In other words, the bond between the polymer and the passivation layer is not broken at extrusion (or other manufacturing) temperatures. This tight bond essentially protects the quantum dot during melting operations such as extrusion and injection molding. Previously, quantum dots exposed to such temperatures simply went dark, their optoelectronic properties extinguished by the processing conditions.

Described herein are methods for making quantum dots, quantum dot-containing polymer resins and the polymer resins themselves. These methods are applicable to various types of quantum dots provided the polymer can tightly bond to the surface of the quantum dot.

By tightly bonding a polymer to the outer surface of the quantum dot, particularly a passivated quantum dot, stability of the quantum dot can be maintained even in a variety of harsh manufacturing conditions, such as, but not limited to, extrusion molding, injection molding, cast molding, solvent casting, and other techniques.

As described further below, in particular embodiments, the polymer is chosen such that it cross-links with the passivation layer (e.g. $Al_2O_3$) of the quantum dot such that the bond dissociation energy associated with the bonds between the polymer and the passivation layer is greater than the energy needed to melt the cross-linked polymer. In other words, the bond between the polymer and the passivation layer is not broken at melt temperatures incurred, for example during extrusion (or other manufacturing) processes. This tight bond essentially protects the quantum dot during melting operations such as extrusion and injection molding. Previously, quantum dots exposed to such temperatures simply went dark, their optoelectronic properties were extinguished by the processing conditions.

Described herein are methods for making quantum dot-containing polymer resins and the polymer resins themselves. These methods are applicable to various types of quantum dots provided the polymer can tightly bond to the surface of the quantum dot.

As noted above, although improved stability can be had by using the polymers and methods disclosed herein with any quantum dot, be it homogenous or alloy-gradient, size-tuned or stoichiometrically tuned, capped or uncapped, passivated or unpassivated, so long as the polymer can tightly bind to the outer surface of the quantum dot, achieving efficient and stable quantum dot (QD) photoluminescence, over the visible range of light, under the combined conditions of high photon flux and chemically adverse external environments benefits from a multi-tiered approach.

First, the QD cores should have a similar surface area across the visible range. Additionally, it is specifically contemplated that cadmium-free (Cd-free) quantum dots may also be used in the methods and polymers described herein. Any Cd-free quantum dot may be used, but those described in U.S. Provisional Patent Application No. 62/338,915 entitled Cadmium-Free Quantum Dots, the disclosure of which is incorporated by reference, and set forth below, are well-suited for use with the methods and polymers disclosed herein.

Second, core passivation should provide both confinement of the exciton wavefunction to the core and a physical barrier to water and oxygen.

Third, the dispersive matrix that provides separation in space for the individual QDs must also provide a stable electronic configuration outside the QD volume that is conducive to photoluminescence, while itself being stable against photodegradation. The embodiment of these three elements into usable materials for the thermoplastic, thermoset and solvent cast production of optical components would accelerate the acceptance of quantum dot based components for display and lighting applications.

1. The Core

It is a basic property of metal and semiconductor materials that their propensity for chemical reactions increases with an increase in surface area to mass. Thus, a 1 cm cube of metal will simply heat up when exposed to flame while that same mass will ignite if ground to a micron-sized powder. The same is true of QD cores with respect to environmental degradation and photodegradation. QDs tuned by core size will differentially degrade due to the increased reactivity of smaller cores (blue-green emitters versus larger cores (yellow-red emitters) because of a higher surface area to mass ratio. This is true in both situations of environmental attack by water and oxygen and under conditions of high photon flux where destructive free radicals are created on the QD surface. At the surface of QDs, there is a population of atoms that are incompletely part of the periodic 3D crystal lattice of the interior. These atoms have vacant or lone-pair electron orbitals. These dangling bonds are the source of undesired chemical reactions both with the external environment and in non-radiative carrier relaxation processes during the photoluminescent emission cycle in which electrons pool at these sites instead of recombining with a hole. This effect is magnified with smaller QDs that have a higher surface area/mass ratio than larger QDs.

Thus, in an optical device composed of multi-colored size-tuned QDs, it is likely that faster degradation of the QDs emitting at the blue end of the visible spectrum will be observed over time, especially under conditions of exposure to water and oxygen combined with high photon flux. It is desirable to have all QD cores in an optoelectronic device be of similar size.

This desired core configurations can be achieved by using QDs synthesized by the methods of Nie (U.S. Pat. Nos. 7,981,667 and 84,201,550 and Qu (U.S. Pat. No. 8,454,927). These QDs are tuned by composition and not by size.

While same color size-tunable dots could be used, when considering the entire visible range, stoichiometrically-tuned quantum dots advantageously have the same size regardless of emission wavelength. Stoichiometrically-tuned quantum dots can be made in accordance with the Nie and Qu patents discussed above or other available methods. An improved method, involving the use of a pH controller to fine tune the emission wavelength is disclosed in U.S. Provisional Patent Application No. 62/338,888 entitled Tunable Semiconductor Nanocrystals And Films And 3-D Structures Containing Them the disclosure of which is incorporated by reference and set forth below herein. Quantum dots made by the methods disclosed therein result in core/shell quantum dots having substantially the same size regardless of emission wavelength.

Capping (i.e. First Passivation Layer)

There are two methods to passivate the dangling bonds on the surface of QDs for higher quantum efficiency (QE) and improved photo/chemical stability: 1) passivating with low MW organic ligands or 2) passivating with inorganic shells. Passivation with organic ligands is simple and straightforward but the surface metal-organic ligand bond is relatively unstable and can be broken and displaced by chemical and/or photochemical reactions. Passivation with inorganic shells is embodied by the well-known core-shell type of QD, and is often referred to as "capping" such as with a ZnS shell. The surface passivation of QD cores with inorganic shells is more stable and has the additional desired effect of providing better confinement of the exciton wavefunction to the core, thus increasing QE. If a QD core is located within a shell material with a larger bandgap energy, the electron and hole wavefunctions are better confined to the core. The recombination probability of the two wavefunctions (electron and hole) increases while the non-radiative decay process via interaction with dangling bonds on the surface decreases. Bandgap and electronic energy levels for common group II-VI, III-V and II-VI semiconductors are shown in FIG. 1.

These core-shell structures are improved with respect to QE and photostability (PS) but are still susceptible to chemical attack by water and oxygen from the environment.

This capping is present in traditional core-shell quantum dots, and can be applied to a number of quantum dots, including the Cd-Free quantum dots and the stoichiometrically/pH controller tuned quantum dots disclosed herein, as well as other quantum dots.

2. Passivation (Second Layer):

It is desirable to provide a second shell of an even wider bandgap material over the first shell that would further confine the exciton wavefunction, passivate the dangling bonds on the outer surface of the first shell material and provide a physical barrier to the diffusion of water and oxygen.

Figure 2:
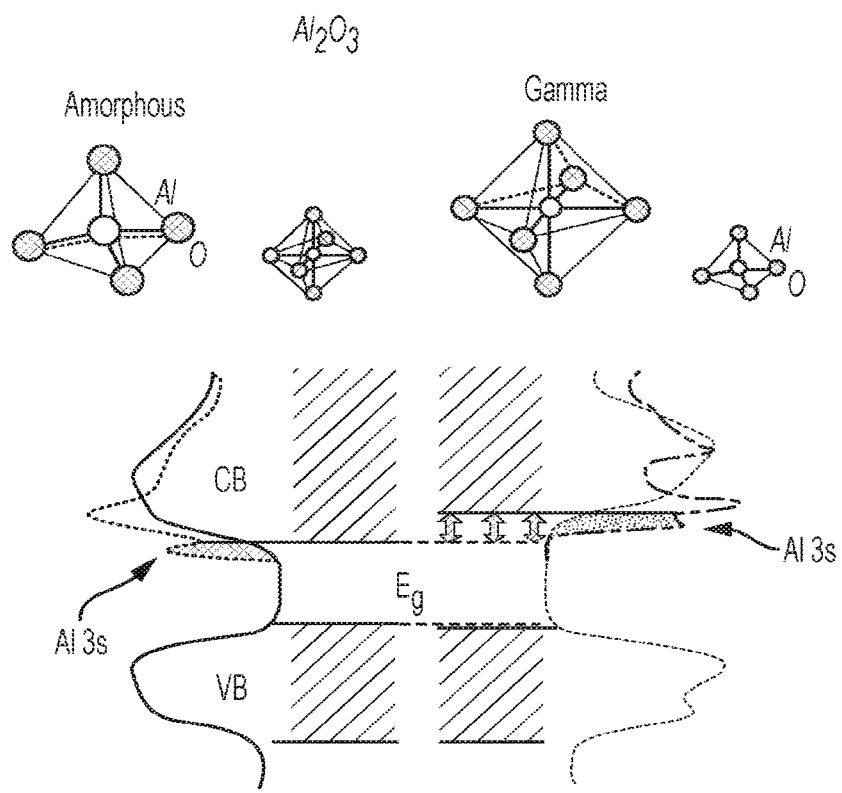
FIG. 2 is a schematic showing valence and conduction bands of am- and γ-Al2O3 films grown by atomic layer deposition.

This can be realized by adding a second shell, a passivation layer, of Al2O3 as described in U.S. Pat. No. 9,425,253 (Qu and Miller) hereby incorporated by reference. The bandgap of Al2O3 is between −3.5 and −11 (FIG. 2) which encompasses the commonly used II-VI and III-V QD core and shell materials.

In addition to having a bandgap energy that encompasses the commonly used QD core-shell materials, Al2O3, at a thickness of 4-5 atomic layers, has the additional property of providing an absolute or near-absolute barrier to the diffusion of oxygen and water. This provides a high barrier of protection from chemical attack by water and oxygen on the sensitive core-shell semiconductor materials.

Figure 3:
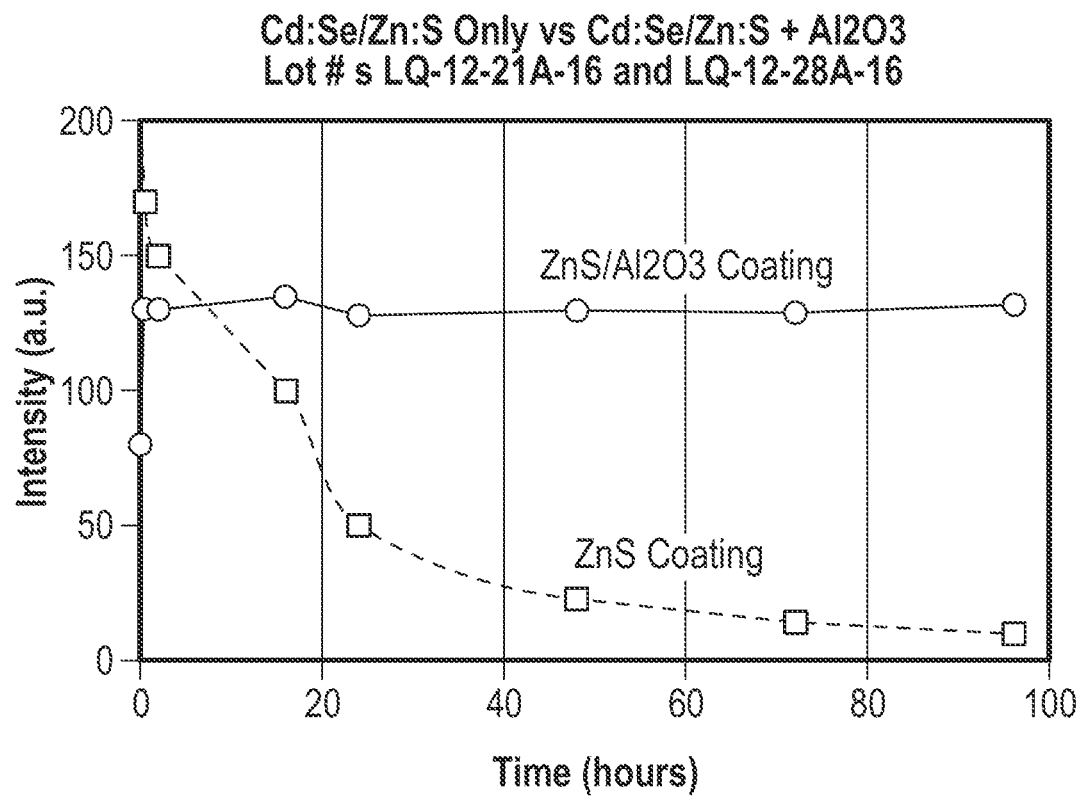
FIG. 3 is graph comparing intensity over time of CdSe/ZnS vs. CdSe/ZnS/Al2O3 quantum dots demonstrating the stability imparted by the Al2O3 passivation layer.

FIG. 3 shows the improved stability achieved by coating a traditional CdSe/ZnS core-shell quantum dot with an Al2O3 passivation layer.

3. The Dispersive Matrix (i.e. the Polymer)

Figure 4:
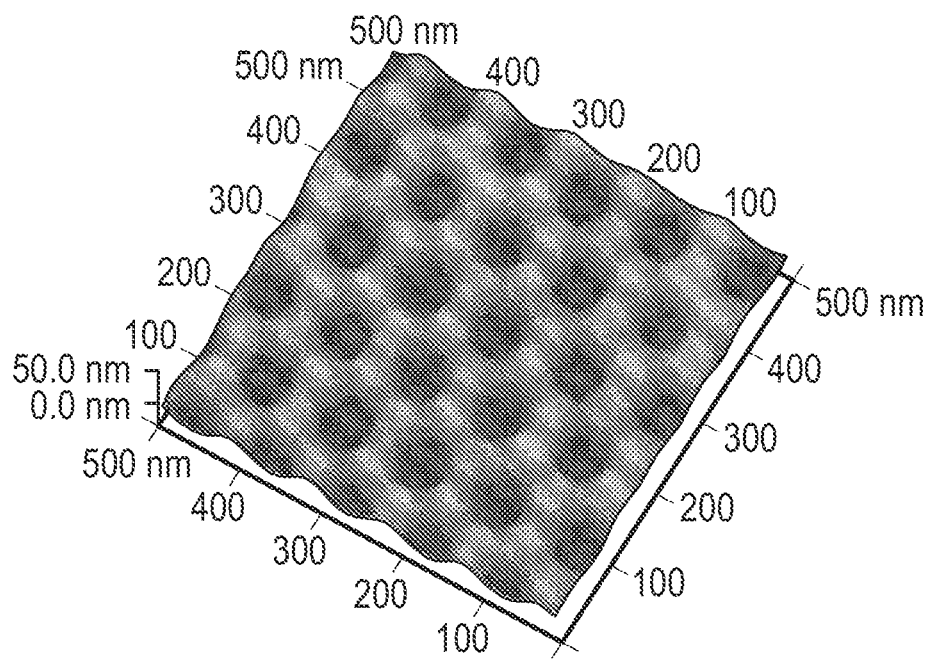
FIG. 4 depicts the surface of Al2O3 is characterized by a repeating pattern of electropositive and electronegative regions.
Figure 5:
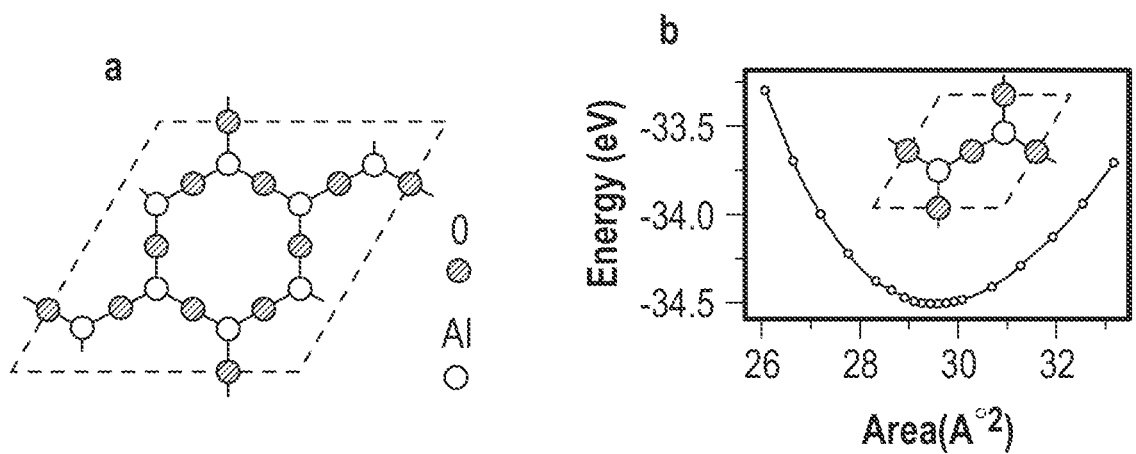
FIG. 5 is another depiction of the repeating pattern of electropositive and electronegative regions of the Al2O3 surface.
Figure 5:
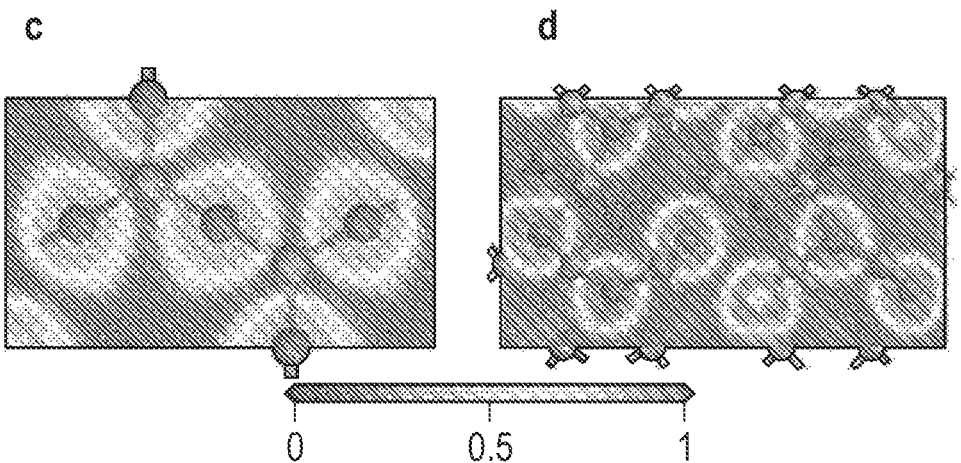

The Al2O3 surface layer offers unique synergistic opportunities to provide a matrix for QD dispersion that is chemically stable and electronically stable at the QD/matrix interface. The surface of Al2O3 is characterized by a repeating pattern of electropositive and electronegative regions as seen in FIGS. 4 and 5.

QDs with an Al2O3 surface show very tight binding affinities to organic ligands containing —COOH and —SH groups and also polymers with repeating carbonyl groups, such as polymers described in invention disclosures by Nulwala assigned to Crystalplex (U.S. Patent Application Ser. Nos. 62/338,888 and 62/338,915 both filed on May 19, 2016 and incorporated herein by reference) and Ser. No. 14/725,658, which is hereby incorporated by reference. This tight bonding has multiple desirable effects in the resulting QD/ligand/polymer matrix.

3.1 Stability of the Electronic Configuration Immediately Outside of the QD Volume It is known that the electronic configuration of the volume immediately adjacent to the QD surface and extending out to the Exciton Bohr Radius can affect the overall QE of a QD population. (see, X. Ji, D. Copenhaver, C. Sichmeller, and X. Peng, "Ligand bonding and dynamics on colloidal nanocrystals at room temperature: the case of alkylamines on CdSe nanocrystals," J. Am. Chem. Soc. 130(17), 5726-5735 (2008). S. F. Wuister, C. de Mello Donegá, and A. Meijerink, "Influence of Thiol Capping on the Exciton Luminescence and Decay Kinetics of CdTe and CdSe Quantum Dots," J. Phys. Chem. B 108(45), 17393-17397 (2004).) This is commonly seen when exchanging small MW organic ligands on the surface of a QD. Even though the QD nanocrystal is not physically changed by the process, a change in photoluminescent QE is observed. What is desired is a local electronic configuration that results in high QE for the QD and a very stable interface between the QD surface and the external matrix that remains unchanged even under extremes of temperature, high photon flux and destructive chemical environments. This can be achieved by binding the Al2O3 surface of the QD to polymers such as those disclosed by Nulwala. The overall binding energy of the matrix polymer to the Al2O3 surface can exceed the energy of a 280° C. extrusion process and provide a stable QD/matrix interface.

3.2 Chemical Stability of the OD/Matrix Interface

In addition to heat, the stability of the QD/matrix interface also can be compromised by the presence of oxygen free radicals. These destructive free radicals can be produced at the QD/matrix interface by a combination of high photon flux and the presence of O2 molecules. The destructive radicals can result in the breaking of covalent bonds in the polymer chains in the matrix (chain scission) and/or disruption of the multiple ionic bonds between the matrix polymer chains and the Al2O3 surface of the QDs.

The QD/matrix interface can be made resistant to oxygen free radical attack by a combination of the redundancy of ionic bonds between matrix polymers and the Al2O3 surface and the intrinsic high O2 barrier properties of the matrix polymer. Specific polymers, notably homopolymers of cyclohexyl acrylate and cyclohexyl acrylate copolymers with methyl methacrylate or heptyl acrylate have repeating carbonyl units oriented in 3D space such that the electronegative carbonyl oxygen repeat distance matches with the repeat distance of the electropositive regions on the surface of Al2O3. This leads to very tight bonding of the polymer to the Al2O3 surface due to a multitude of binding sites per polymer chain.

In addition, these acrylic polymers have high O2 barrier properties. The combined effect of suspending QDs in these matrices is very stable bonding of the polymers to the QD surface and minimal O2 diffusion to the binding site.

3.3 Stable Dispersion in the 3D Matrix Volume

In addition to the chemical stability of the OD/matrix interface, the QDs must be dispersed without clumping to function properly in photoluminescent mode.

The polymers described in 3.2, and others disclosed by Nulwala, disperse QDs in this fashion. This is due to the fact that the polymer-QD bonding is more stable than QD-QD self bonding. Once bound in this fashion the QD/matrix is stable throughout downstream processing such as thermoplastic, thermoset and solvent-casting operations. In addition, the physical properties of the polymer matrix can be improved by the interaction with the QD nanoparticles. The physical crosslinking sites provided by the QDs can change and improve the physical properties of the polymer such as glass transition temperature, durometer, impact resistance, tensile strength and chemical resistance.

4. Processing 4.1 Preparation of the Composite

The QD/polymer composite can be prepared by multiple methods.

Polymers can be polymerized in a continuous reactor and QDs can be introduced into the continuous stream either before or after complete polymerization. The resulting QD/polymer composite stream can then be collected and the solvent removed for use as a thermoplastic material to produce an optical component. Solvent may be retained or added to produce a solvent casting composite to produce an optical film.

Polymers can be completely polymerized then mixed with QDs in an appropriate solvent. Mixing, such as high shear mixing, can be applied to increase binding of polymers to the QD surface. The QD/polymer composite can be left as is for use in solvent film casting or the solvent can be removed to produce a dry composite for thermoplastic processing to produce optical components.

QDs can be suspended in monomer or a mixture of monomers or a mixture of monomers and oligomers or a mixture of monomers and multifunctional monomers with multiple vinyl groups that produce crosslinking in the final polymer. This thermoset material can later be cured by heat or UV radiation to produce the final optical component.

4.1 Downstream Processing of the Composite

The three commonly used processes to produce optical components from plastics are thermoplastic, thermoset, and solvent casting.

Included in these general categories are injection molding, extrusion, thermoset potting, thermoset film, solvent cast film, solvent cast ink jet printing, solvent cast 3D printing, thermoset ink jet printing, thermoset 3D printing, thermoplastic 3D printing, and other techniques.

Other than in the operating examples or where otherwise indicated, all numbers or expressions referring to quantities of ingredients, reaction conditions, etc. used in the specification and claims are to be understood as modified in all instances by the term "about." Accordingly, unless indicated to the contrary, the numerical parameters set forth in the following specification and attached claims are approximations that can vary depending upon the desired properties, which the present invention desires to obtain. At the very least, and not as an attempt to limit the application of the doctrine of equivalents to the scope of the claims, each numerical parameter should at least be construed in light of the number of reported significant digits and by applying ordinary rounding techniques.

Notwithstanding that the numerical ranges and parameters setting forth the broad scope of the invention are approximations, the numerical values set forth in the specific examples are reported as precisely as possible. Any numerical values, however, inherently contain certain errors necessarily resulting from the standard deviation found in their respective testing measurements.

Also, it should be understood that any numerical range recited herein is intended to include all sub-ranges subsumed therein. For example, a range of "1 to 10" is intended to include all sub-ranges between and including the recited minimum value of 1 and the recited maximum value of 10; that is, having a minimum value equal to or greater than 1 and a maximum value of equal to or less than 10. Because the disclosed numerical ranges are continuous, they include every value between the minimum and maximum values. Unless expressly indicated otherwise, the various numerical ranges specified in this application are approximations.

As used herein, the singular forms "a", "an" and "the" include plural reference unless the context clearly dictates otherwise.

As used herein, the term "about" means plus or minus 10% of the numerical value of the number with which it is being used. Therefore, about 50% means in the range of 45%-55%.

As used herein, the term "copolymer" means a polymer resulting from the polymerization of two or more polymerizable unsaturated molecules and is meant to include terpolymers, tetra polymers, etc.

As used herein, the term "core/shell" means particles that have a quantum dot as a core and one or more shells or coatings generally uniformly surrounding the quantum dot core. Non-limiting examples of shell materials include Cd or Zn salts of S or Se and/or metal oxides.

The terms "include," "comprise," and "have" and their conjugates, as used herein, mean "include but not necessarily limited to."

As used herein, the term "Group II element" is meant to include one or more elements from the IUPAC group 2 of the periodic table selected from Cd, Zn and Hg, except when discussing Cd-free embodiments, in which case Group II element refers one or more elements from the IUPAC group 2 of the periodic table selected from Cu, Zn and Hg.

As used herein, the term "Group VI element" is meant to include one or more elements from the IUPAC group 16 of the periodic table selected from S, Se, Te, Po, and O.

As used herein, the terms "nanoparticles", "nanocrystals", and "passivated nanocrystals" refer to small structures in which the ordinary properties of their constituent materials are altered by their physical dimensions due to quantum-mechanical effects, often referred to as "quantum confinement." For the sake of clarity, the use of these terms in this disclosure refers to objects possessing quantum-confinement properties, which are separated from one another in all three dimensions; enabling incorporation into liquids, vapors, or solids.

"Optional" or "optionally" means that the subsequently described structure, event, or circumstance may or may not be present or occur, and that the description includes instances where the structure is present and where it is not or instances where the event occurs and instances where it does not.

As used herein, the term "polymer" is meant to encompass, without limitation, oligomers, homopolymers, copolymers and graft copolymers.

As used herein, the term "quantum dot" typically refers to a nanocrystalline particle made from a material that in the bulk is a semiconductor or insulating material, which has a tunable photophysical property in the near ultraviolet (UV) to far infrared (IR) range, and in particular, the visible range.

In many embodiments of the present invention the term quantum dot includes semiconductor nanocrystals (SCN) that include transition metals, non-limiting examples being Cd and Zn, and anions from the IUPAC group 16 of the periodic table, non-limiting examples being Se, S, Te, and O.

As used herein, the term "composite" refers to materials that contain quantum dots and a polymer combined into a matrix that includes quantum dots dispersed throughout the matrix. In some embodiments, the quantum dots are dispersed substantially evenly throughout the matrix.

Aspects of this disclosure relate to semiconductor nanocrystals tuned to a predetermined emission wavelength (i.e. a quantum dot). In some instances, the quantum dots may be a plurality of quantum dots containing a ranges of predetermined emission wavelengths. Particularly, in some embodiments, a plurality of quantum dots contains a homogenous mixture of quantum dots emitting a desired plurality of desired wavelengths.

Aspects of the present invention relate to films and 3-D structures comprising core/shell quantum dot particles dispersed in a acrylate resin. The films and 3-D structures provide the ability to cast films and place 3-D structures onto commercially applicable equipment resulting in highly stable quantum dot—polymer composite films and 3-D structures. The inventive films and 3-D structures can be used in display and lighting applications. In particular aspects, a single-coat down-conversion film (SCDF) that includes a single layer of the quantum dot—polymer composite film, sandwiched between at least two transparent films and 3-D structures can be used. The single and multilayer inventive films and 3-D structures enable a simpler and more cost effective product that provides at least the performance of more complicated structures, The Quantum Dot Core Any semiconductor nanocrystals known in the art may be used as the core for the quantum dots for incorporation into the polymers described herein, non-limiting examples being the relevant semiconductor nanocrystals disclosed in U.S. Pat. Nos. 6,207,229; 6,322,901; 6,576,291; 6,821,337; 7,138,098; 7,825,405; 7,981,667; 8,071,359; 8,288,152; 8,288,153; 8,420,155; 8,454,927; 8,481,112; 8,481,113; 8,648,524; 9,063,363; and 9,182,621 and U.S. Published Patent Application Nos. 2006/0036084, 2010/0270504, 2010/0283034; 2012/0039859; 2012/0241683; 2013/0335677; 2014/0131632; and 2014/0339497.

The quantum dots employed herein may be any quantum dot, and may be:
  a) cadmium-containing or cadmium free
  b) alloy-gradient or non-gradient (i.e. homogenous)
  c) size-tunable, stoichiometrically-tunable, or not, or
  d) any combination of these.

Additionally, contemplated herein are new methods of making quantum dots, particularly a method of making same-size stoichiometrically and pH controller-tuned quantum dots and Cd-free quantum dots are disclosed herein, in and of themselves, and also for incorporation into the polymers as disclosed herein.

Thus, traditional core/shell quantum dots such as those that are commercially available, other Cd-free quantum dots, as well as the same-size stoichiometrically and pH controller-tuned quantum dots and Cd-free quantum dots described and disclosed herein may be incorporated into the polymers as described further below.

Cd-Free Quantum Dots

As used herein, the term "Cd-free" means the object so described is substantially free of cadmium or was made without using cadmium, or does not contain cadmium. For example, the terms "Cd-free semiconductor nanocrystals" and Cd-free semiconductor "quantum dots" refer to semiconductor nanocrystals or quantum dots that are substantially free of, made without using or do not contain cadmium.

"Substantially free of cadmium" means containing less than 5% cadmium, less than 3% cadmium, less than 1%, less than 0.5%, less than 0.3%, less than 0.1% or any range of values between any two of these values and any value there between.

As used herein, with respect to Cd-Free quantum dots, the term "Group II element" is meant to include one or more elements from the IUPAC group 2 of the periodic table selected from Cu, Zn and Hg.

As used herein, the term "Group III element" is meant to include one or more elements selected from In, Ga, Al, and Tl.

As used herein, the term "Group VI element" is meant to include one or more elements from the IUPAC group 16 of the periodic table selected from S, Se, Te, Po, and O.

In some embodiments, suitable Cd-free semiconductor nanocrystals that can provide useful quantum dot cores include, but are not limited to, II-II-III-VI semiconductor nanocrystals (SCN) of the formula ABCD where A is a Group II element, B is another group II element, C is a group III element, and D is a group VI element.

In particular embodiments the Group II element can be one or more selected from Cu, Zn and Hg, the group III element can be one or more selected from In, Ga, Al, and the group VI element can be can be one or more selected from S, Se, Te, Po, and O.

In particular embodiments, the Cd-free nanoparticles are ZnCuInS and/or ZnCuGaS

In other particular embodiments, suitable semiconductor nanocrystals that can provide useful Cd-free quantum dot cores in the invention include II-II-III-III-VI semiconductor nanocrystals (SCN) of the formula ABCDE where A is a first Group II element, B is second group II element, C is a first group ill element, D is a second III group element, and E is a group VI element.

In further aspects of this particular embodiment the Group II element can be one or more selected from Cu, Zn and Hg, the group III element can be selected from In, Ga, Al, and the group Vi element can be selected from S, Se, Te, Po, and O.

In additional specific aspects of this particular embodiment, the Cd-free nanoparticles are ZnCuInAlS and/or ZnCuInGaS.

In further embodiments, suitable Cd-free semiconductor nanocrystals that can provide quantum dot cores useful in the invention include II-II-III-VI-VI semiconductor nanocrystals (SCN) of the formula ABCDE where A is a first Group II element, B is second group II element, C is a group III element, D is a first group VI element, and E is a second group element.

In aspects of this further embodiment the Group II element can be one or more selected from Cu, Zn and Hg, the group III element In, Ga, Al, and the group Vi element can be selected from S, Se. Te, Po, and O.

In a specific aspect of this further embodiment, the Cd-free nanoparticles are ZnCuInSSe, ZnCuGaSSe, ZnCuAlSSe and combinations thereof.

In additional embodiments, suitable Cd-free semiconductor nanocrystals that can provide quantum dot cores useful in the invention II-II-III-III-VI-VI include semiconductor nanocrystals (SCN) of the formula ABCDEF, where A is a first Group II element, B is a second group II element, C is a first group III element, D is a second group III element, and D is a group element, E is a first group VI element, and F is a second group VI element.

In aspects of this additional embodiment the Group II elements can be one or more selected from Cu, Zn and Hg, the group III elements can be one or more selected from In, Ga, Al, and the group Vi elements can be one or more selected from S, Se. Te, Po, and O.

In specific aspects of this additional embodiment, the Cd-free nanoparticles can be ZnCuInAlSSe, ZnCuInGaSSe, ZnCuAlGaSSe and combinations thereof.

Source of Group II and Group III Elements

In some embodiments, the source of the group II and group III elements are metal oxides.

In particular embodiments, source of the group II and group III elements can be selected from ZnO, CuO, In2O3, Al2O3.

In some embodiments, the source of the group II and III elements are fatty acid salts.

In particular embodiments, the group II and group III elements can be selected from ZnX, CuX, InX, AlX, X can be a carboxylic acid with chain length from C1 to C22.

Any suitable carboxylic acid can be used. In some embodiments, the carboxylic acids used can be one or more selected from acetic acid, propionic acid, butyric acid, myristoleic acid, palmitoleic acid, sapienic acid, oleic acid, elaidic acid, vaccenic acid, linoleic acid, linoelaidic acid, α-Linolenic acid, arachidonic acid, eicosapentaenoic acid, erucic acid, docosahexaenoic acid, stearic acid, palmitic acid, and arachidic acid.

In a particular embodiment, the carboxylic acid is oleic acid.

In a specific embodiment, the carboxylic acid is acetic acid.

Source of VI Elements

In some embodiments, the source of the group VI elements is a pure elemental powder.

In particular embodiments, the group VI elements can be selected from elemental S, Se, Te, Po, and O.

In some embodiments, the source of the group VI elements are group VI element containing molecules.

In particular embodiments, the group VI element is present as the corresponding thiolate of a single functional alkyl thiol containing molecule, such as but not limited to, alkyl thiols with a chain length of from C1 to C22.

In specific embodiments, the group VI element is the thiolate of 1-Dodecanthiol.

In particular embodiments, the group VI element can be a dithiolate of the corresponding dithiol molecules, such as but not limited to those dithiol molecules having a chain length of from C1 to C22.

Ligands

In embodiments, the Cd-free nanoparticles are coated with ligands.

In particular embodiments, the ligands can be selected from single chain fatty acids with chain lengths from C8 to C22.

Any suitable fatty acid can be used. In some embodiments, the fatty acids used can be one or more selected from myristoleic acid, palmitoleic acid, sapienic acid, oleic acid, elaidic acid, vaccenic acid, linoleic acid, linoelaidic acid, α-Linolenic acid, arachidonic acid, eicosapentaenoic acid, erucic acid, docosahexaenoic acid, stearic acid, palmitic acid, caprylic acid and arachidic acid.

In specific embodiments, the fatty acid ligands include caprylic or octanoic acid.

In particular embodiments, the ligands can be selected from single chain thiols with chain lengths from C1 to C22.

In specific embodiments, the ligands include 1-Dodecanthiol.

In particular embodiments, the ligands can be a mixture of fatty acid and long chain thiols with a chain length of from C1 to C22.

In specific embodiments, the ligands are a mixture of 1-Dodecanthiol and Octanoic acid.

In some embodiments, the solvents used for the synthesis of Cd-free nanoparticles include one or more C12 to C20 hydrocarbons. In many embodiments, the precursor solution solvents can be chosen as required by the physical properties of the materials used in the precursor solution and as required by the apparatus available for synthesis. In particular embodiments, a high boiling organic solvent is employed, typically with a boiling point above about 150, in some cases above about 200, and in other cases above about 225° C., In particular embodiments, the solvent includes one or more selected from octadecane, dodecane, hexadecane and icosane.

In some embodiments, tributylphosphine (TBP) is used as a solvent in the precursor solution. In other embodiments, a mixture of TBP and C12 to C20 hydrocarbons are used in the precursor solution. In these embodiments, including TBP can be advantageous because it provides a strong dipole moment, which can aid in dissolving the Group VI elements. In many embodiments, the precursor solution solvents can be chosen as required by the physical properties of the materials used in the precursor solution and as required by the apparatus available for synthesis.

Cd-Free Core Syntheses

Some embodiments provide a method for synthesizing Cd-free semiconductor nanocrystal cores. The method includes heating a precursor solution that includes the desired mixture of Group II element(s), Group III elements(s) and Group VI element(s) as described above in one or more solvents that include one or more C12 to C20 hydrocarbons and one or more fatty acids to a temperature sufficient to produce the Cd-free semiconductor nanocrystal cores.

In some embodiments, the emission wavelength of the synthesized Cd-free nanoparticles is determined by molar ratio of the precursors, and the concentration in and type of C12 to C20 hydrocarbon solvent. Once the proper amounts of chemicals needed for the syntheses are weighed, they are placed in a suitable reaction vessel. Without degassing the temperature is raised sufficiently to initiate the reaction, and keep at that temperature for a period of time sufficient to allow the reaction to equilibrate.

In some embodiments, the reaction temperature is at least about 200° C., in some cases at least about 220° C., in other cases at least about 240° C. and in some instances at least about 250° C. and can be up to about 300° C., in some cases up to about 280° C. and in other cases up to about 270° C. The temperature employed will depend on the particular precursors and solvents used. The reaction temperature can be any value or range between any of the values recited above.

In some embodiments, the reaction time is at least about 5 minutes, in some cases at least about 8 minutes and in other cases at least about 9 minutes and can be up to about 60 minutes, in some cases up to about 45 minutes, in other cases up to about 30 minutes and in some instances up to about 15 minutes. The reaction time employed will depend on the particular precursors and solvents used. The reaction time can be any value or range between any of the values recited above.

In a specific embodiment, the reaction time is about 10 minutes.

Core Purification

Purification of the Cd-free nanoparticle cores is performed to substantially reduce or eliminate unreacted precursors and byproducts generated during the reaction. In some embodiments, purification of the Cd-free nanoparticle cores can be accomplished by:

1) Transferring the Cd-free nanoparticle core synthesis solution to a centrifuge tube and diluting to 7.5 times its volume with a 1:3 mixture of a nopolar and polar solvent (a non-limiting example being hexanes and butanol).
2) Centrifuging the solution from (1) until crystal pellets form, and pouring off the supernatant.
3) Washing the crystals three times with a 1:3 mixture of a nonpolar and polar solvent (a non-limiting example being hexane and methanol), using 6.5 times the volume of the original Cd-free nanoparticle core synthesis solution for each wash. First adding the nonpolar solvent to suspend the crystals and then adding the polar solvent to precipitate them.
4) Suspending the crystals in a nonpolar solvent (a non-limiting example being hexane) at 81% the volume of the synthesis solution.

Non-Traditional QDs: Stoichiometrically/pH Controlled Tuning

The embodiments below relate to a quantum dot made in accordance with the teachings of U.S. Provisional Patent Application No. 62/338,888, employing a pH controller in methods for stoichiometrically tuning QDs to aid in establishing the desired emission wavelength.

In some embodiments, the core is a II-VI-VI semiconductor nanocrystal (SCN) having a predetermined emission wavelength. In some embodiments, these are made by heating a II-VI-VI SCN precursor solution that includes a Group II element, a first Group VI element, a second Group VI element, and a pH controller in one or more solvents that together include one or more $C_{12}$ to $C_{20}$ hydrocarbons and one or more fatty acids to a temperature sufficient to produce the II-VI-VI SCNs. The amount of pH controller is adjusted to provide the predetermined emission wavelength from the SCNs.

Without wishing to be bound by theory, Applicants believe that the use of oleic acid creates superior quantum dots because they are well-suited for subsequent capping, particularly with ZnS.

Pre-Cursor Solution

In some embodiments, suitable semiconductor nanocrystals that can provide quantum dot cores useful in the present invention include II-VI-VI semiconductor nanocrystals (SCN) of the formula WYxZ(1-x) where W is a Group H element, Y and Z are different Group VI elements, and 0<X<1.

In particular embodiments the Group II element can be one or more selected from Cd, Zn and Hg and the Group VI element can be one or more selected from S, Se, Te, Po, and O.

In some embodiments, the source of the group VI elements is soluble in C12 to C20 hydrocarbons and are organic miscible with the one or more fatty acids used to make the II-VI-VI II-VI-VI SCN. In many embodiments, pure group VI elements in powder form are used.

In particular embodiments, a desired predetermined emission wavelength to be emitted from the SCNs is identified and the amount of pH controller is adjusted such that the resultant SCNs have the predetermined emission wavelength.

pH Controller

In some embodiments, the amount of pH controller is selected to tune the emission maximum wavelength of the SCN to the desired predetermined emission wavelength. When a specific wavelength is desired, a few synthesis reactions using different concentrations of pH controllers and, optionally, different molar ratios of precursors are run to construct a calibration curve. The required concentration of pH adjuster and, if determined, the required ratio of precursors are then identified for the desired wavelength from the calibration curve.

In particular aspects of this embodiment, the emission wavelength from the SCNs, without pH controller, can be any wavelength in the visible range, and in particular from about 400 nm to about 700 nm, and any wavelength between those values. That is, SCNs can be made with a known emission wavelength. Then by introduction of a pH controller that emission wavelength can be "tuned" from that known emission wavelength to a desired predetermined wavelength.

When the pH controller is included in the precursor solution, the emission wavelength of the SCN shifts to a longer wavelength. In some aspects, the SCN emission wavelength can increase at least 3 nm, in some cases at least 5 nm and in other cases at least 7 nm and can increase up to 25 nm, in some cases up to 20 nm, and in other cases up to 17 nm for each 0.1 weight percent of pH controller included in the precursor solution. The amount of SCN emission wavelength can be any value or range between any of the values recited above. The amount of SCN emission wavelength increase can vary based on the size of the semiconductor nanocrystals, the particular pH controller used and the particular Group II and Group VI elements used. Through manipulation of these factors, the emission wavelength can be precisely tuned to a desired emission wavelength.

The pH controller is included in the precursor solution at a level that provides the desired SCN emission wavelength increase, often referred to as "tuning" the SCN. The pH controller can be present in the precursor solution at a level of from about 0.01 weight percent of the precursor solution, in some cases about 0.1 weight percent of the precursor solution, in other cases about 0.15 weight percent of the precursor solution and in some instances about 0.2 weight percent of the precursor solution and can be up to about 1 weight percent of the precursor solution, in some cases up to about 0.9 weight percent of the precursor solution, in other cases up to about 0.8 weight percent of the precursor solution and in some instances up to about 0.7 weight percent of the precursor solution. The amount of pH controller will be an amount sufficient to achieve the desired tuning and will typically not exceed an amount that will increase the SCN emission wavelength beyond the visible spectrum. The amount of pH controller in the precursor solution can be any value or range between any of the values recited above.

Any pH controller that can maintain a desired pH and effect the emission wavelength tuning described above can be used in the SCN solution. In some embodiments, the pH controller can be an oxide or carboxylic acid salt of a Group II element. In particular embodiments the pH controller can be selected from zinc salts of acetic acid, citric acid, lactic acid, propionic acid, butyric acid, tartaric acid, and valeric acid. In particular embodiments, the pH controller is an oxide or carboxylic acid salt of a Group II element.

In some aspects of the invention, the pH controller is selected from zinc salts of acetic acid, citric acid, lactic acid, propionic acid, butyric acid, tartaric acid, and valeric acid.

In some embodiments, the C12 to C20 hydrocarbons used in the SCN solution can be one or more selected from hexadecene, octadecene, eicosene, hexadecane, octadecane and Icosane.

In other embodiments, the fatty acids used in the SCN solution can be one or more selected from myristoleic acid, palmitoleic acid, sapienic acid, oleic acid, elaidic acid, vaccenic acid, linoleic acid, linoelaidic acid, α-Linolenic acid, arachidonic acid, eicosapentaenoic acid, erucic acid, docosahexaenoic acid, stearic acid, palmitic acid, and arachidic acid.

Any pH controller that can maintain a desired pH and effect the emission wavelength tuning described above can be used in the precursor solution. In some embodiments, the pH controller can be an oxide or carboxylic acid salt of a Group II element. In particular embodiments the pH controller can be a salt of an acid selected from the group consisting of acetic acid, citric acid, lactic acid, propionic acid, butyric acid, tartaric acid, and valeric acid. In some embodiments, the salt is a zinc salt of an acid selected from the group consisting of acetic acid, citric acid, lactic acid, propionic acid, butyric acid, tartaric acid, and valeric acid.

In embodiments, the pH controller is soluble in the one or more fatty acids used in the precursor solution.

Hydrocarbon Solvent

Any suitable C12 to C20 hydrocarbons can be used in the precursor solution. In some embodiments, the C12 to C20 hydrocarbons in the precursor solution can include one or more hydrocarbons selected from hexadecene, octadecene, eicosene, hexadecane, octadecane and icosane.

In some some embodiments, tributylphosphine (TBP) is used as a solvent in the precursor solution. In other embodiments, a mixture of TBP and C12 to C20 hydrocarbons are used in the precursor solution. In these embodiments, including TBP can be advantageous because it provides a strong dipole moment, which can aid in dissolving the Group VI elements. In many embodiments, the precursor solution solvents can be chosen as required by the physical properties of the materials used in the precursor solution and as required by the apparatus available for synthesis.

Fatty Acid

Any suitable fatty acid can be used in the precursor solution. In some embodiments, the fatty acids used in the precursor solution can be one or more fatty acids selected from myristoleic acid, palmitoleic acid, sapienic acid, oleic acid, elaidic acid, vaccenic acid, linoleic acid, linoelaidic acid, α-Linolenic acid, arachidonic acid, eicosapentaenoic acid, erucic acid, docosahexaenoic acid, stearic acid, palmitic acid, and arachidic acid.

In a particular embodiment of the invention, the fatty acid is oleic acid.

In particular embodiments, the II-VI-VI SCN precursor is prepared by dissolving the Group II element, the first Group VI element, and the second Group VI element in a solvent that includes the pH controller, octadecene and a fatty acid to provide the II-VI-VI SCN precursor solution.

In other embodiments, the II-VI-VI SCN precursor is prepared by preparing a first solution by dissolving the Group II element and the first Group VI element in a first solvent that includes octadecene and a fatty acid; preparing a second solution by dissolving the second Group VI element in a second solvent that includes octadecene; mixing the first and second solutions to provide a II-VI-VI SCN precursor solution. In this embodiment, both of the first and second solutions include the pH controller.

In additional embodiments, the II-VI-VI II-VI-VI SCN precursor is made by preparing a first solution by dissolving a Group II element in a first solvent that includes octadecene and a fatty acid; preparing a second solution by dissolving a first Group VI and a second. Group VI element in a second solvent that includes octadecene; and mixing the first and second solutions to provide a II-VI-VI SCN precursor solution. In this embodiment, both of the first and second solutions include the pH controller.

In further embodiments, the II-VI-VI SCN precursor is prepared by preparing a first solution by dissolving a Group II element in a first solvent that includes octadecene and a fatty acid; preparing a second solution by dissolving a first Group VI element in a second solvent that includes octadecene; preparing a third solution by dissolving a second Group VI element in a third solvent that includes tributylphosphine; and mixing the first, second, and third solutions to provide a II-VI-VI SCN precursor solution. In this embodiment, one or more of the first, second and third solutions include the pH controller.

In all of the embodiments described above, the II-VI-VI semiconductor nanocrystals are synthesized by heating the II-VI-VI SCN precursor solution to a temperature sufficient to form the desired quantum dot core. In embodiments, the precursor solution temperature is at least 200°, in some cases at least 225°, in many cases at least 250° and in many instances at least 270° C. and can be up to about 400°, in some cases up to about 350° and in other cases up to about and 330° C. The temperature at which the II-VI-VI semiconductor nanocrystals are grown will vary depending on the particular Group II and Group VI elements and ratios used as well as the solvents, fatty acids and pH controller employed.

In all of the embodiments described above, the II-VI-VI semiconductor nanocrystals are synthesized by heating the II-VI-VI SCN precursor solution to a temperature described above for a period of time that is at least sufficient to form the desired quantum dot core. In some embodiments, the reaction time is at least 40, in some cases at least 50, in many cases at least 60 and in many instances at least 70 minutes and can be up to about 120, in some cases up to about 110 and in other cases up to about 100 minutes. The reaction time over which the II-VI-VI semiconductor nanocrystals are grown will vary depending on the temperature, the particular Group II and Group VI elements and ratios used as well as the solvents, fatty acids and pH controller employed.

In a particular embodiment of the invention, the quantum dot core can be prepared by selecting Group II elements that are soluble in the fatty acid. Non-limiting examples of suitable fatty acids being stearic acid and oleic acid. The pH controller soluble in the fatty acid, an oxide or acetate of a Group II element, is used. The source of the Group VI elements are chosen such that they are soluble in an organic solvent that is miscible with the fatty acid used to dissolve the Group II. In this embodiment, the organic solvent can be tributylphosphine and/or octadecene.

In this embodiment, the pH, or electrical environment of the reaction system is determined by introducing the pH controller into the reaction system. The pH controller is selected based on having a negative or positive charge depending on the desired type of nanocrystal and the properties of precursors being used; and are miscible with the reaction system employed. In particular embodiments, the pH controller is Zinc acetate.

Further to this embodiment, once the pH controller, solvents, and elements are selected, solutions of the elements are prepared in aliquots that are mixed together for nanocrystal synthesis. After mixing, the reaction is allowed to go to completion.

In this embodiment, the emission maximum is determined by 1) the molar ratio of the two group six elements; and 2) the concentration of PH controller.

The present invention provides methods of tuning a quantum dot core. The inventive, convenient method for tuning the emission maximum wavelength of the resulting quantum dot cores includes identifying a desired emission maximum. Once a specific wavelength is identified, a few synthesis reactions varying the molar ratios of the precursors and the concentration of the pH controller can be performed to identify the molar ratios of the elements and concentration of pH controller that provide the desired wavelength. In many some embodiments, a calibration curve can be constructed by performing the synthesis reactions outlined above using different ratios of elements and concentrations of pH controller. Once the calibration curve is constructed, the ratios of elements and concentration of pH controller can be identified for any desired emission maximum.

Particular advantages to some of the embodiments of the present invention include not having to rely on a particular reaction time. Once the pH controller and stock solutions are prepared, aliquots of each can be mixed together and stirred at a temperature sufficient to support crystal growth, in many embodiments from about 200° C. to about 400° C., for about 40 to about 120 minutes. Advantageously, it is not important to end the reaction at a specific time. Once the method according to the invention is followed and the reaction is complete the solution can continue to be stirred at growth temperatures without altering the final quantum dot core product. In many prior art methods of synthesizing nanocrystals, an additional 1 to 5 seconds of extra reaction time substantially alters the product.

In particular embodiments, the semiconductor materials of the quantum dot cores may have a gradient of one or more of the semiconductor materials radiating from the center of the nanocrystal or quantum dot to the outermost surface of the nanocrystal. Such nanocrystals or quantum dots are referred to herein as "concentration-gradient quantum dots." For example, in some embodiments, a concentration-gradient quantum dot having at least a first semiconductor and a second semiconductor may be prepared such that the concentration of the first semiconductor gradually increases from the center of the concentration-gradient quantum dot to the surface of the quantum dot. In such embodiments, the concentration of the second semiconductor can gradually decrease from the core of the concentration-gradient quantum dot to the surface of the quantum dot. Without wishing to be bound by theory, concentration-gradient quantum dot may have a band gap energy that is non-linearly related to the molar ratio of the at least two semiconductors.

Concentration-gradient quantum dots may be prepared from any semiconductor material known in the art including those semiconductor materials listed above, and concentration-gradient quantum dots may be composed of two or more semiconductor materials. In particular embodiments, concentration-gradient quantum dots may be alloys of CdSeTe having a molecular formula $CdS_{1-x}Te_x$, CdSSe having a molecular formula $CdS_{1-x}Se_x$, CdSTe having a molecular formula $CdS_{1-x}Te_x$, ZnSeTe having a molecular formula ZnSe1-x Tex, ZnCdTe having a molecular formula Zn1-x CdxTe, CdHgS having a molecular formula Cd1-x HgxS, HgCdTe having a molecular formula HgCdTe, InGaAs having a molecular formula InGaS, GaAlAs having a molecular formula GaAlAs, or InGaN having a molecular formula InGaN, where x in each example can be any fraction between 0 and 1.

The methods described above provide various uncapped semiconductor nanocrystals, referred to collectively as quantum dot cores herein.

Some embodiments provide quantum dot cores and in particular II-VI-VI semiconductor nanocrystals made according to the methods described above.

Some embodiments provide quantum dot cores and II-VI-VI semiconductor nanocrystal that include Cd, S and Se, where the nanocrystal has been modified by a zinc alkylcarboxylate (such as zinc acetate). The quantum dot cores and II-VI-VI semiconductor nanocrystals generally correspond to the formula $WY_xZ_{(1-x)}$ where W is a Group II element, Y and Z are different Group VI elements, and $0<X<1$. In particular embodiments, the quantum dot cores and II-VI-VI semiconductor nanocrystals have a predetermined emission wavelength.

The II-VI-VI semiconductor nanocrystals of the invention can have any diameter, and, thus, be of any size, provided that quantum confinement is achieved. In certain embodiments, the II-VI-VI semiconductor nanocrystals described herein have a primary particle size of less than about 10 nm in diameter. According to other embodiments, the II-VI-VI semiconductor nanocrystals have a primary particle size of between about 1 to about 500 nm in diameter. In other embodiments, a primary particle size of between about 1 to about 100 nm in diameter, and in still other embodiments, a primary particle size of between about 5 to about 15 nm in diameter. As used herein, the phrase "primary particle" refers to the smallest identifiable subdivision in a particulate system. Primary particles can also be subunits of aggregates.

Standard Core/Shell Quantum Dots (CdSe/ZnS)

Figure 6:
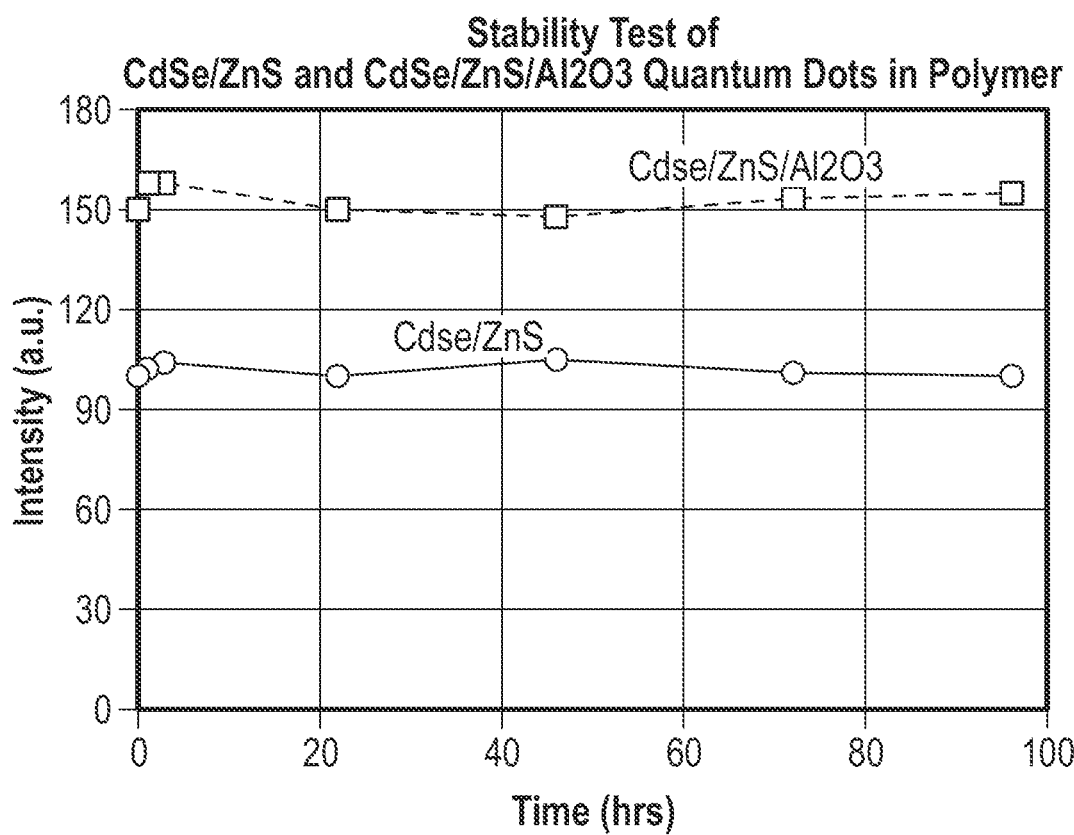
FIG. 6 is graph comparing intensity over time of polymer encapsulated quantum dots in accordance with some embodiments, showing stability of the polymer encapsulated quantum dots over time.

Standard core/shell quantum dots of the CdSe/ZnS variety were obtained from a commercial source. The quantum dots were processed to assess the stability of the quantum dots with and without an Al2O3 passivation layer, and the stability of the quantum dots with and without the Al2O3 passivation layer additionally with an without incorporation into the polymer matrix described herein. FIG. 6 depicts the results of those tests.

To assess the effect of the Al2O3 passivation layer, QDs with and without the Al2O3 passivation layer were coated naked on glass slides and exposed to 85/85 conditions (85° C., 85% humidity.) There was a marked difference as seen in FIG. 6 between $Al_2O_3$ passivated QDs and those that without the Al2O3 passivation. The relative intensity is not necessarily important in this analysis, but the drop in the intensity of the QDs without $Al_2O_3$ passivation layer indicates a much less stable QD.

FIG. 6 shows that a core/shell. QD with or without the Al2O3 passivation layer benefits from incorporation in the polymer as described below herein. Here, QDs with and without the passivation layer were dispersed and embedded in the polymer described herein and tested under the 85/85 test conditions. FIG. 6 shows that the dispersion in the polymer lead to stable QDs for both samples. Thus, dispersion within the polymer as disclosed herein leads to stable QDs.

Shell Growth (Capping) of Cd-Free Nanoparticle Cores

Capping the purified Cd-free nanoparticle cores can be accomplished by the following methods.

Method 1:

Maintaining an oxygen free environment during the capping process. Take a sample of the purified Cd-free nanoparticle cores and perform the steps below. The quantities indicated are for every 0.1 mmol of Group II element in the Cd-free nanoparticle core solution.)

1) Vacuum purging until the nonpolar solvent has evaporated.
2) Adding 4.00 g trioctylphosphine oxide, and vacuum purging for 10 minutes. Optionally, 0.2 g stearic acid can be added along with the trioctylphosphine oxide prior to performing the vacuum purge, if a shell comprising stearic acid is desired.
3) Heating to about 100° C. for about 30 minutes under vacuum and then to 200° C. without vacuum for 30 minutes.
4) Preparing a capping solution by mixing 40 μL Zn(CH3) 2, 80 μL Hexamethyldisilathiane (CAS #3385-94-2), and 2.00 mL trioctylphosphine in an oxygen-free environment.
5) Dripping the capping solution into solution (3) at about 200-220° C. over about 5 minutes for every 2.0 mL trioctylphosphine used.
6) Stirring for about 30 minutes to about 2 hours at 200° C. under nitrogen.
7) Allowing the solution to cool to room temperature.

A graph of ratios of elements versus emission wavelength can be prepared to provide a calibration curve. The calibration curve can be used to determine the proper fraction of elements needed to obtain crystals that fluoresce at the desired wavelength.

Method 2:

Load purified Cd-free nanoparticle cores into a three-neck flask with desired amounts of Zinc Acetate, elemental sulfur, 1-dodecanethiol, octadecane and octanoic acid. Degassing for 20 about minutes, then filling the flask with nitrogen, raising the temperature high enough to allow the reaction to proceed for about 60 minutes at that temperature.

Capping the Quantum Dot Core

Embodiments of the present invention relate to a method of capping a semiconductor nanocrystal. Any of the quantum dot cores disclosed hereinabove can be used in the methods according to these embodiments. One or more of the semiconductor nanocrystals described above are provided and heated in a solution containing one or more C12 to C20 hydrocarbons and one or more fatty acids to form an SCN solution. A solution containing dialkyl zinc, hexaalkyldisilathiane and trialkylphosphine is added to the SCN solution and heated to a temperature sufficient to produce a capped II-VI-VI semiconductor nanocrystal.

In particular embodiments, a predetermined emission wavelength from the capped semiconductor nanocrystal is identified and an amount of pH controller may be added to provide the predetermined emission wavelength from the capped semiconductor nanocrystal.

In some embodiments, the amount of pH controller is selected to tune the emission maximum wavelength of the capped SCN. When a specific wavelength is desired, a few synthesis reactions using different concentrations of pH controllers and the particular SCN to be capped are run to construct a calibration curve. The required concentration of pH adjuster is then identified for the desired wavelength from the calibration curve.

In particular aspects of this embodiment, the emission wavelength from the capped semiconductor nanocrystal when no pH controller is present can be any wavelength in the visible range and in particular from about 400 nm to about 700 nm and any wavelength between those values. When the pH controller is included in the SCN solution, the emission wavelength of the capped semiconductor nanocrystal shifts to a longer wavelength. In some aspects of the invention, the SCN emission wavelength can increase at least 2 nm, in some case at least 3 nm and in other cases at least 4 nm and can increase up to 15, in some cases up to 12 and in other cases up to 10 nm for each 0.1 weight percent of pH controller included in the SCN solution. The amount of capped semiconductor nanocrystal emission wavelength can increase and can be any value or range between any of the values recited above. The amount of capped semiconductor nanocrystal emission wavelength can increase and vary based on the size of the capped semiconductor nanocrystal, the particular pH adjuster used and the particular Group II and Group VI elements used.

The pH controller is included in the SCN solution at a level that provides the desired capped semiconductor nanocrystal emission wavelength increase, often referred to as "tuning" the capped semiconductor nanocrystal. The pH controller can be present in the SCN solution at a level of from about 0.01, in some cases about 0.1, in other cases about 0.15 and in some instances about 0.2 weight percent of the SCN solution and can be up to about 1, in some cases up to about 0.9, in other cases up to about 0.8 and in some instances up to about 0.7 weight percent of the SCN solution. The amount of pH controller will be an amount sufficient to achieve the desired tuning and will typically not exceed an amount that will increase the capped semiconductor nanocrystal emission wavelength beyond the visible spectrum. The amount of pH controller in the SCN solution can be any value or range between any of the values recited above.

Any pH controller that can maintain a desired pH and effect the emission wavelength tuning described above can be used in the SCN solution. In some embodiments, the pH controller can be an oxide or carboxylic acid salt of a Group II element. In particular embodiments the pH controller can be selected from zinc salts of acetic acid, citric acid, lactic acid, propionic acid, butyric acid, tartaric acid, and valeric acid. In particular embodiments, the pH controller is an oxide or carboxylic acid salt of a Group II element.

In some aspects of the invention, the pH controller is selected from zinc salts of acetic acid, citric acid, lactic acid, propionic acid, butyric acid, tartaric acid, and valeric acid.

In some embodiments, the C12 to C20 hydrocarbons used in the SCN solution can be one or more selected from hexadecene, octadecene, eicosene, hexadecane, octadecane and Icosane.

In other embodiments, the fatty acids used in the SCN solution can be one or more selected from myristoleic acid, palmitoleic acid, sapienic acid, oleic acid, elaidic acid, vaccenic acid, linoleic acid, linoelaidic acid, α-Linolenic acid, arachidonic acid, eicosapentaenoic acid, erucic acid, docosahexaenoic acid, stearic acid, palmitic acid, and arachidic acid.

In embodiments, the dialkyl zinc is dimethyl zinc, the hexaalkyldisilathiane is hexamethyldisilathiane and the trialkylphosphine is trioctylphosphine.

In many embodiments, the temperature the SCN solution containing dialkyl zinc, hexaalkyldisilathiane and trialkylphosphine is heated to in order to form the capped quantum dot is between about 150° C. and 350° C.

The methods described herein above provide capped semiconductor nanocrystals.

The capped semiconductor nanocrystals of the invention can have any diameter, and, thus, be of any size, provided that quantum confinement is achieved. In certain embodiments, the capped semiconductor nanocrystals described herein have a primary particle size of less than about 10 nm in diameter. According to other embodiments, the II-VI-VI semiconductor nanocrystals have a primary particle size of between about 1 to about 500 nm in diameter. In other embodiments, a primary particle size of between about 1 to about 100 nm in diameter, and in still other embodiments, a primary particle size of between about 5 to about 15 nm in diameter. As used herein, the phrase "primary particle" refers to the smallest identifiable subdivision in a particulate system. Primary particles can also be subunits of aggregates.

Cd-Free Al2O3 Capping

In some embodiments a passivation layer is applied to a capped Cd-free nanoparticle core prepared as described above. In these embodiments, an aluminum capping material is prepared by mixing trimethylaluminum and trioctylphosphine to form a capping solution. The capping solution is added to a solution of core/shell Cd-free nanoparticles at a temperature sufficient to grow monolayers of aluminum on the surface of the core/shell Cd-free nanoparticles to provide aluminum coated core/shell Cd-free nanoparticle cores. In particular embodiments, the monolayers can be from at least 1 atom thick, in some cases at least two atoms thick and in other cases at least 3 atoms thick and can be up to 20 atoms thick, in some cases up to 15 atoms thick, in other cases up to 10 atoms thick and in some instances up to 5 atoms thick. In many instances the capping solution is mixed with the solution of capped Cd-free nanoparticle cores at a temperature of from 100° C., in some cases at least 150° C. and in other cases at least 175° C. and can be mixed at a temperature up to about 300° C., in some cases up to about 250° C. and in other cases up to about 225° C. The aluminum coated capped Cd-free nanoparticle cores are then allowed stand in air at a temperatures of less than 100° C. to oxidize for a time sufficient to convert all or some of the monolayers of aluminum to monolayers of Al2O3, providing aluminum oxide coated capped Cd-free nanoparticle cores ("passivated core/shell Cd-free nanoparticles").

The fabrication methods for the passivated core/shell Cd-free nanoparticles may be further modified in some embodiments to achieve desired features. For example, nanoparticle characteristics such as surface functionality, surface charge, particle size, zeta (ζ) potential, hydrophobicity, and the like, may be optimized depending on the particular application of the passivated nanocrystals. For example, in some embodiments, modified surface chemistry and small particle size may contribute to reduced clearance of the nanoparticles. In other embodiments, the passivated nanoparticles are stable in water or other liquid medium without substantial agglomeration and substantial precipitation for at least 30 days, preferably for at least 90 days, and more preferably for at least 120 days. The term "stable" or "stabilized" means a solution or suspension in a fluid phase wherein solid components (i.e., nanoparticles) possess stability against aggregation and agglomeration sufficient to maintain the integrity of the compound and preferably for a sufficient period of time to be useful for the purposes detailed herein. As used herein, the term "agglomeration" refers to the formation of a cohesive mass consisting of particulate subunits held together by relatively weak forces (for example, van der Waals or capillary forces) that may break apart into particulate subunits upon processing, for example. The resulting structure is called an "agglomerate."

The passivated core/shell Cd-free nanoparticles can have any diameter, and, thus, be of any size, provided that quantum confinement is achieved. In certain embodiments, the passivated core/shell Cd-free nanoparticles described herein have a primary particle size of less than about 10 nm in diameter. According to other embodiments, the passivated core/shell Cd-free nanoparticles have a primary particle size of between about 1 nm to about 500 nm in diameter. In other embodiments, a primary particle size of between about 1 to about 100 am in diameter, and in still other embodiments, a primary particle size of between about 5 nm to about 15 nm in diameter. As used herein, the phrase "primary particle" refers to the smallest identifiable subdivision in a particulate system. Primary particles can also be subunits of aggregates.

Passivating a Capped II-VI-VI Semiconductor Nanocrystal (e.g. Al2O3 Passivation)

In some embodiments a passivation layer is applied to a capped II-VI-VI semiconductor nanocrystal prepared as described above. In these embodiments, an aluminum capping material is prepared by mixing trimethylaluminum and trioctylphosphine to form a capping solution. The capping solution is added to a solution of core/shell nanocrystals at a temperature sufficient to grow monolayers of aluminum on the surface of the core/shell nanocrystals to provide aluminum coated core/shell nanocrystals. In particular embodiments, the monolayers can be from at least 1, in some cases at least two and in other cases at least 3 atoms thick and can be up to 20, in some cases up to 15, in other cases up to 10 and in some instances up to 5 atoms thick. In many instances the capping solution is mixed with the solution of capped II-VI-VI semiconductor nanocrystal at a temperature of from 100, in some cases at least 150 and in other cases at least 175° C. and can be mixed at a temperature up to about 300, in some cases up to about 250 and in other cases up to about 225° C. The aluminum coated capped II-VI-VI semiconductor nanocrystal are then allowed stand in air at temperatures less than 100° C. and oxidize for a time sufficient to convert the all or some of the monolayers of aluminum to monolayers of Al2O3, to provide aluminum oxide coated capped II-VI-VI semiconductor nanocrystal ("passivated core/shell nanocrystals").

The fabrication methods for the passivated nanocrystals of the invention may be further modified in some embodiments to achieve desired features. For example, nanoparticle characteristics such as surface functionality, surface charge, particle size, zeta (ζ) potential, hydrophobicity, and the like, may be optimized depending on the particular application of the passivated nanocrystals. For example, in some some embodiments, modified surface chemistry and small particle size may contribute to reduced clearance of the nanoparticles. In other embodiments, the passivated nanoparticles are stable in water or other liquid medium without substantial agglomeration and substantial precipitation for at least 30 days, preferably for at least 90 days, and more preferably for at least 120 days. The term "stable" or "stabilized" means a solution or suspension in a fluid phase wherein solid components (i.e., nanoparticles) possess stability against aggregation and agglomeration sufficient to maintain the integrity of the compound and preferably for a sufficient period of time to be useful for the purposes detailed herein. As used herein, the term "agglomeration" refers to the formation of a cohesive mass consisting of particulate subunits held together by relatively weak forces (for example, van der Wants or capillary forces) that may break apart into particulate subunits upon processing, for example. The resulting structure is called an "agglomerate."

The passivated capped nanocrystals of the invention can have any diameter, and, thus, be of any size, provided that quantum confinement is achieved. In certain embodiments, the passivated nanocrystals described herein have a primary particle size of less than about 10 nm in diameter. According to other embodiments, the passivated nanocrystals have a primary particle size of between about 1 to about 500 nm in diameter. In other embodiments, a primary particle size of between about 1 to about 100 nm in diameter, and in still other embodiments, a primary particle size of between about 5 to about 15 nm in diameter. As used herein, the phrase "primary particle" refers to the smallest identifiable subdivision in a particulate system. Primary particles can also be subunits of aggregates.

Particular embodiments described above provide a capped II-VI-VI semiconductor nanocrystal that includes a core that includes a II-VI-VI semiconductor nanocrystal containing Cd, S and Se, where the nanocrystal has been modified by a zinc alkylcarboxylate and a cap layer selected from a layer containing ZnS, a layer containing Al2O3 and a layer containing ZnS and a second layer containing Al2O3.

As a non-limiting more particular description of the capped semiconductor nanocrystals according to the invention the source of the various elements should be soluble in a fatty acid such as stearic acid or oleic acid. As a non-limiting example, an oxide or acetate compound of the group two elements are often soluble in stearic acid. The source of both group VI elements should be chosen such that they are soluble in an organic solvent that is miscible with the fatty acid used to dissolve the group two element. Pure group six elements in powder form are often suitable. Tributylphosphine (TBP) and octadecene are examples of solvents that are miscible with oleic acid. In many embodiments, IBP provides a strong dipole moment, if needed, to dissolve the group six element. The solvents should be chosen as required by the physical properties of the elements and as required by the apparatus available for synthesis.

In many embodiments, the pH, or electrical environment of the reaction system is determined by introducing additional materials to the reaction system. These materials should 1) have a negative or positive charge depending on the type of nanocrystal desired and the properties of precursors used; and 2) are mixable with the chosen reaction system. In particular embodiments, Zinc acetate is the pH controller.

Continuing with this embodiment, it is important to remember that the method according to the invention does not require timing of a critical end point. The reaction can be allowed to go to completion. The emission maximum is determined by 1) the molar ratio of the two group six elements; and 2) the concentration of the pH controller, not the reaction time.

Further to this embodiment and the description above, tuning the emission maximum wavelength to a specific desired wavelength requires only a few synthesis reactions using different molar ratios of precursors and concentrations of pH controllers. This allows for fine tuning the molar ratios and the concentration of pH controllers to the desired wavelength.

In embodiments, a calibration curve is generated by performing a number of syntheses using different concentrations of PH controller. Stock solutions of pH controller are prepared and aliquots of each are mixed together and stirred at a high enough temperature to support crystal growth. Suitable temperatures can be between about 200° C. and about 400° C., for about 40 to about 120 minutes. It is not important to end the reaction at a specific time. In embodiments, once the reaction is complete the solution can be stirred at growth temperatures without altering the product. As a non-limiting example, stirring at growth temperatures for 10, 20, and 30 minutes at temperature does not change the end product semiconductor nanocrystals when a CdSeS system is used. As indicated above, prior art methods of nanocrystal synthesis where 1-5 seconds of extra reaction time is employed substantially alters the product.

The method of this embodiment produces uncapped semiconductor nanocrystals, referred to as "cores". Capping the cores makes them more stable and increases their quantum efficiency. As a non-limiting example, capping with ZnS is known to those skilled in the art. Prior to capping the cores of this embodiment, it is helpful, though not required, to purify the crystals.

The cores according to this embodiment can be purified by first diluting the synthesis mixture to 7.5 times its volume with a 1:3 mixture of hexane and butanol. This causes the nanocrystals to precipitate which can then be pelletized via centrifugation. The crystals are then washed three times by first suspending the crystals in hexane and then adding three times the volume of methanol, which causes the crystals to re-precipitate. After the final wash, the crystals are dissolved in hexane for capping.

Other particular embodiments provide a method of providing capped CdSeS cores. The method includes three steps; core synthesis, core purification, and core capping.

The particular core synthesis of this embodiment includes:
1A) Preparing a desired amount of pH controller and precursor by mixing the pH controller and precursor with octadecene and a fatty acid (oleic acid and/or stearic acid), thoroughly sparging with nitrogen gas, and heating to about 250-350° C. until the solution is clear.
2A) Preparing solutions of sulfur and selenium in an oxygen free environment and mixing aliquots of each mixed to achieve the desired fluorescent wavelength, so that when added to the cadmium precursor solution the molar ratios of Cd:S:Se are 2:X:(1−X), where 0<X<1.
3A) Combining the mixture of sulfur and selenium with octadecene to about 45-50 volume percent of the cadmium precursor solution while maintaining an oxygen free environment.
4A) Injecting the solution from step (3A) into solution from step (1A) at 250-350° C. and then maintain a temperature of from about 250-350° C. The resulting solution is stirred about 40-120 minutes, until the reaction is complete, while maintaining an oxygen free environment.

The resulting cores are purified according to this particular embodiment using the following method:
1B) Transferring the core synthesis solution from step (4A) to a centrifuge tube and diluting to 7.5 times its volume with a 1:3 mixture of hexane and butanol.
2B) Centrifuging the mixture from (1B) until crystal pellets are formed and pouring off the supernatant.
3B) Washing the crystal pellets from step (2B) three times with 1:3 hexane:methanol, using about 6.5 times the volume of the original core synthesis solution for each wash. Adding hexane to the suspend crystals and then adding methanol to precipitate the crystals.
4B) Suspending the precipitated crystals from step (3B) in hexane at about 75-85% of the volume of the synthesis solution.

The resulting purified cores are capped according to this particular embodiment by maintaining an oxygen free environment during the capping process and taking a sample of the purified cores from step (4B) and using the following method (The quantities indicated are used with about 0.1 mmol of cadmium in the core solution in step (4B)):

1C) Vacuum purging until substantially all of the hexane has evaporated.
2C) Adding about 0.2 g of Zinc Acetate (pH controller), 10 ml of octadecene and a fatty acid, and vacuum purging for 10 minutes.
3C) Heating to about 75-125° C. for about 30 minutes and then to about 175-225° C. for about 30 minutes.
4C) Preparing a capping solution by mixing about 35-45 µL Zn(CH3)2, about 75-85 µL Hexamethyldisilathiane (CAS #3385-94-2), and about 1.85-2.15 mL trioctylphosphine in an anaerobic environment.
5C) Slowly adding the capping solution of step (4C) into the solution of step (3C), over a period of about 4-6 minutes for every 2.0 mL trioctylphosphine used.
6C) Stirring the solution from step (5C) for about 1.5-2.5 hours at 175-225° C. under nitrogen.
7C) Allowing the solution from (6C) to cool to room temperature.

Polymer Containing the Capped Quantum Dot Core

As used herein, the term "acrylate" is meant to include esters of both acrylic and methacrylic acid, such as the corresponding alkyl esters often referred to as acrylates and methacrylates, and other esters which may contain one or more of N, P, Si and S, which the term "acrylate" is meant to encompass. Acrylates, as used herein, have the formula:

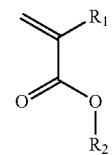

I wherein $R_1$, is hydrogen or methyl; and
$R_2$ is selected from the group consisting of methyl; ethyl; propyl; dodecyl; steryl; isopropyl; butyl; isobutyl; pentyl; cyclopentyl; isopentyl; linear $C_{1-18}$ alkyl; linear, branched, and cyclic $C_{6-8}$ alkyl.

As used herein, the term "acrylate resin" refers to polymers resulting from the polymerization of one or more acrylates and optionally one or more other polymerizable unsaturated molecules together with any (non-quantum dot) additives that may be blended into the polymer.

Unless otherwise specified, all molecular weight values are determined using gel permeation chromatography (GPC) using appropriate polystyrene standards. Unless otherwise indicated, the molecular weight values indicated herein are weight average molecular weights (Mw).

Various embodiments are directed to polymers, resins, films or 3-D structures that contain semiconductor nanocrystals as described above dispersed in an acrylate resin. Any suitable acrylate resin can be used in the invention. A non-limiting example of suitable acrylate resins include those that include repeat or monomer units derived from polymerizing one or more monomers according to the formula:

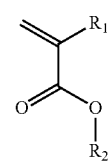

I wherein $R^1$ is hydrogen or methyl and
$R^2$ is selected from the group consisting of methyl; ethyl; propyl; dodecyl; steryl; isopropyl; butyl; isobutyl; pentyl;

cyclopentyl; isopentyl; linear containing from 1-18 Carbon atoms, branched and cyclic hexyl; linear, branched and cyclic heptyl; and linear branched and cyclic octyl.

Compounds of formula I are referred to herein as acrylate monomers.

The amount and type of the acrylate monomers in the acrylate resin is determined based on the desired properties of the resulting film and/or 3-D structure or other product and the particular semiconductor nanocrystals used in the film.

In some embodiments, the acrylate resin is made from methyl methacrylate (i.e. R1=R2=methyl) and, optionally, one or more other monomers according to structure I. In this embodiment, the amount of methyl methacrylate can be at least 1%, in some cases at least 5%, in other cases at least 10%, in some instances at least 20% and in other instances at least 25% and can be 100%, in some cases up to 95%, in other cases up to 90%, in some instances up to 80%, in other instances up to 70%, in some situations up to 60% and in other situations up to 50% based on the weight of the acrylate resin. The amount of methyl methacrylate in the acrylate resin can be any value or range between any of the values recited above.

In some embodiments, the acrylate resin is made from methyl acrylate (i.e. R1=R2=methyl) and, optionally, one or more other monomers according to structure I. In this embodiment, the amount of methyl acrylate can be at least 1%, in some cases at least 5%, in other cases at least 10%, in some instances at least 20% and in other instances at least 25% and can be 100%, in some cases up to 95%, in other cases up to 90%, in some instances up to 80%, in other instances up to 70%, in some situations up to 60% and in other situations up to 50% based on the weight of the acrylate resin. The amount of methyl acrylate in the acrylate resin can be any value or range between any of the values recited above.

The amount of methyl methacrylate and/or methyl acrylate in the acrylate resin is determined based on the desired properties of the resulting film or structure and the particular capped or capped and passivated semiconductor nanocrystals used in the film.

In these embodiments, the other acrylate monomer(s) are used at a level that brings the total percentage of monomers used in the acrylate resin to 100%.

In particular some embodiments, the acrylate resin is made from cyclohexyl acrylate (i.e. R1=H, R2=cyclohexyl) and, optionally, one or more other monomers according to structure I. In this embodiment, the amount of cyclohexyl acrylate can be at least 1%, in some cases at least 5%, in other cases at least 10%, in some instances at least 20% and in other instances at least 25% and can be 100%, in some cases up to 95%, in other cases up to 90%, in some instances up to 80%, in other instances up to 70%, in some situations up to 60% and in other situations up to 50% based on the weight of the acrylate resin. The amount of cyclohexyl acrylate in the acrylate resin can be any value or range between any of the values recited above. In these embodiments, the other acrylate monomer(s) are used at a level that brings the total percentage of monomers used in the acrylate resin to 100%. The amount of cyclohexyl acrylate in the acrylate resin is determined based on the desired properties of the resulting film or structure and the particular capped or capped and passivated semiconductor nanocrystals used in the film.

Other embodiments are directed to films and 3-D structures that contain semiconductor nanocrystals as described above dispersed in polymers derived from polymerizing one or more acrylate monomers of formula I with one or more monomers according to following formulae:

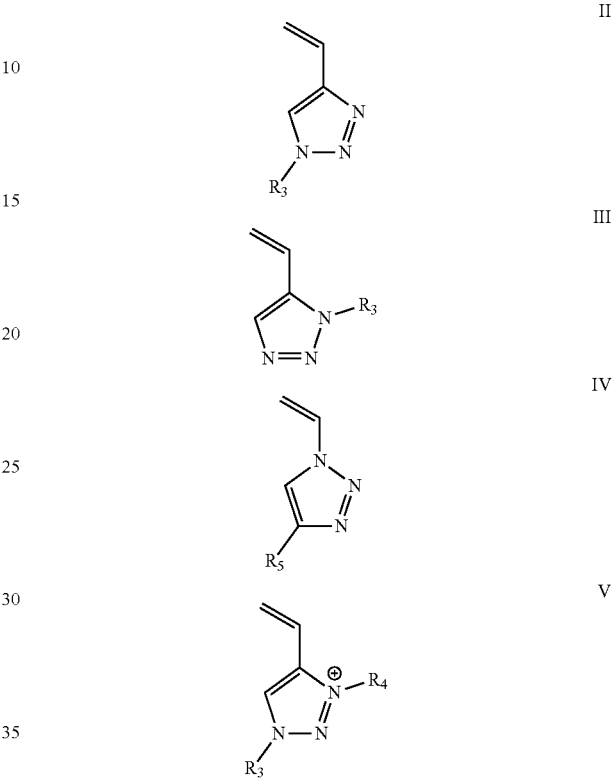

wherein
each of R3 and R4 in structures II through V, is independently selected from methyl, ethyl, propyl, isopropyl, butyl, isobutyl, pentyl, cyclopentyl, isopentyl. C6 to C12 linear, branched, cyclic and aromatic hydrocarbyl, and polyethylene glycol; and
R5 is selected from of hydrogen, methyl, ethyl, propyl, isopropyl, butyl, isobutyl, pentyl, cyclopentyl, isopentyl C6 to C12 linear, branched, cyclic and aromatic hydrocarbyl, and polyethylene glycol.

Monomers of Formulae II-V are referred to herein as nitrogen containing monomers.

In particular embodiments, the acrylate resin is made from one or more acrylate monomers and one or more nitrogen containing monomers. In this embodiment, the amount of acrylate monomer can be at least 1%, in some cases at least 5%, in other cases at least 10%, in some instances at least 20% and in other instances at least 25% and can be up to 99%, in some cases up to 95%, in other cases up to 90%, in some instances up to 80%, in other instances up to 70%, in some situations up to 60% and in other situations up to 50% based on the weight of the acrylate resin. The amount and type of acrylate monomer and the corresponding amount and type of nitrogen containing monomers in the acrylate resin can be any value or range between any of the values recited above, in these embodiments, the nitrogen containing monomers are used at a level that brings the total percentage of monomers used in the acrylate resin to 100%. The amount and type of acrylate monomer and the amount and type of nitrogen containing monomer in the acrylate resin is determined based on the desired properties of the resulting film and the particular capped or capped and passivated semiconductor nanocrystals used in the film.

Other embodiments are directed to films and 3-D structures that contain capped or capped and passivated 2-6-6 semiconductor nanocrystals as described above dispersed in polymers derived from polymerizing one or more acrylate monomers according structure I and one or more nitrogen containing monomers according to one or more of structures II, III, IV and V.

In some embodiments, the films and 3-D structures described herein can be prepared using any suitable method. A non-limiting example of preparing the films and 3-D structures described herein include dispersing the capped nanocrystals in a suitable solution of polymers derived from polymerizing one or more acrylate monomers according structure I and/or one or more nitrogen containing monomers according to one or more of structures II, III, IV and V. Typically an organic solvent is used in the polymer solution. Any good solvent for the polymers can be used, however, solvents that can be removed to promote film formation are often used. Suitable solvents include, but are not limited to C6-C20 linear, branched and cyclic aliphatic and aromatic solvents. In particular embodiments, hexane, octane, decene, benzene, toluene, and xylene are suitable solvents. The solution of capped nanocrystals, polymer, and solvent is typically homogenized to uniformly disperse the capped nanocrystals in the polymer solution and then drawn into a film, and the solvent allowed to evaporate.

In some embodiments, the nanocrystal/polymer composite described herein typically contain nanocrystals at a level of at least 0.0001 wt %, in some cases at least 0.01 wt %, in other cases at least 0.1 wt %, in some instances at least 1 wt %, and in other instances at least 5 weight percent of nanocrystals to composite and can contain up to about 75%, in some cases about 60%, in other cases about 50%, in some instances about 40% and in other instances about 30% weight percent nanocrystals to composite. The amount of nanocrystals will depend on the intended end use, the particular nanocrystals used as well as the particular polymer used. The amount of nanocrystals in the nanocrystal/polymer composite can be any value or range between any of the values recited above, (e.g. 0.0001 to 75% by weight of the composite).

The nanocrystal/polymer composite of the current invention, may also contain additives, such as for example, primary antioxidants (such as hindered phenols, including vitamin E); secondary antioxidants (such as phosphites and phosphonites); nucleating agents, plasticizers or process aids (such as fluoroelastomer and/or polyethylene glycol bound process aid), acid scavengers, stabilizers, anticorrosion agents, blowing agents, other ultraviolet light absorbers such as chain-breaking antioxidants, etc., quenchers, antistatic agents, slip agents, anti-blocking agent, pigments, dyes and fillers and cure agents such as peroxide. The particular additives used are chosen so as not to interfere with the desired properties to be obtained from the nanocrystal/polymer composite.

These and other common additives in the composite industry may be present in nanocrystal/polymer composite at from about 0.01 to about 50 wt % in some embodiments, and from about 0.1 to about 20 wt % in another embodiment, and from about 1 to about 5 wt % in yet another embodiment, wherein a desirable range may include any combination of any upper wt % limit with any lower wt % limit.

Multilayer Films and 3-D Structures Including Films and 3-D Structures Containing the Capped Quantum Dot Core Various embodiments are directed to multilayer films and 3-D structures that include one or more layers that include the films and 3-D structures containing capped or capped and passivated quantum dot cores as described above. The quantum dot cores may be uncapped, capped, passivated, or any combination thereof.

Figure 7:
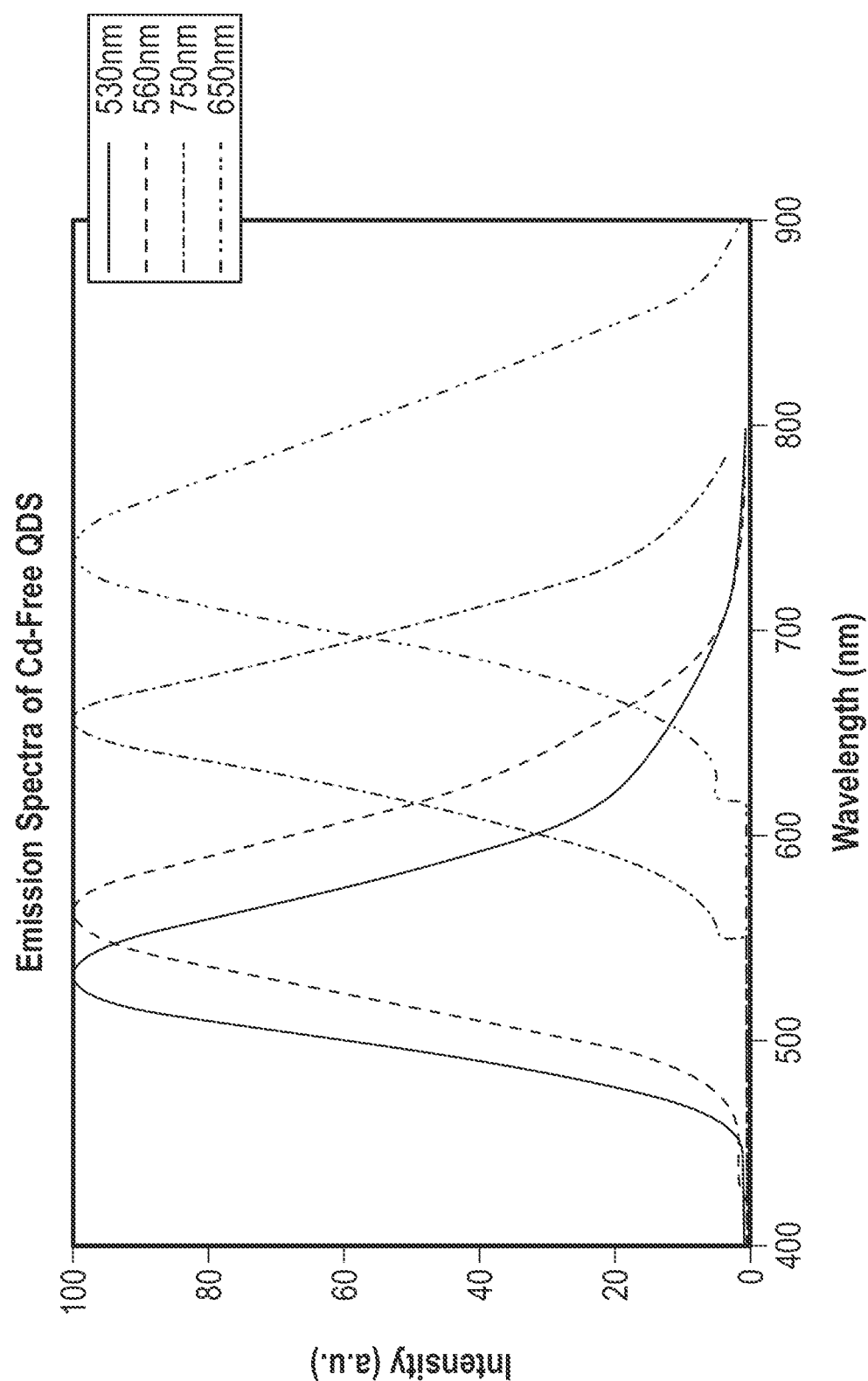
FIG. 7 depicts a multilayer film that includes a film containing quantum dot cores in accordance with some embodiments.

As a non-limiting example, FIG. 7 shows multilayer film 10 that includes first layer 12 and last layer 16 and a middle layer 14 that includes a film containing capped or capped and passivated quantum dot cores as described above. In some embodiments, first layer 12 and last layer 16 can have a refractive index of from at least 1.47, in some cases at least 1.5 and in other cases at least 1.52 and can have a refractive index of up about 1.7, in some cases up to about 1.65 and in other cases up to about 1.6.

Generally, multilayer films and 3-D structures according to the invention as depicted in FIG. 7 can be made by first dispersing quantum dots in a suitable solvent and dissolving a acrylate resin, resin containing nitrogen monomers, and/or a resin made from acrylate monomers and nitrogen containing monomers into the quantum dot dispersion. The resulting dispersion is then coated onto a first film, which is then dried. A second film, and any subsequent film, is then heat laminated over the dispersion coated surface of to the first film.

In many prior art systems, the reabsorption behavior of quantum dots and their lack of resistance to environmental degradation has been addressed using expensive multi-laminate structures. These structures are used to efficiently convert blue light from light emitting diodes ("LEDs") into longer quantum dot emitted wavelengths ("downconversion") and to protect the quantum dots for extended use in optoelectronic devices. Examples of such structures include cutoff filters, dichroic layers, separation of quantum dots into multiple single-color layers and other complicated multilaminate structures. However, these structures are complex and expensive to manufacture.

The invention disclosed herein, as exemplified in FIG. 7 provides a single-coat downconversion film (SCDF) that includes a single, layer 14 of a quantum dot containing matrix sandwiched between two transparent films (12, 16) and 3-D structures, which can be easily manufactured at low cost. A combination of maximum dispersion and refractive index (RI) matching enables a simple and cost effective product that, at a minimum, provides the performance of more complicated structures. Thus, embodiments of the multilayer films and 3-D structures according to the invention rely on a combination of maximum quantum dot dispersion and refractive index matching to achieve optimal performance.

Figure 8:
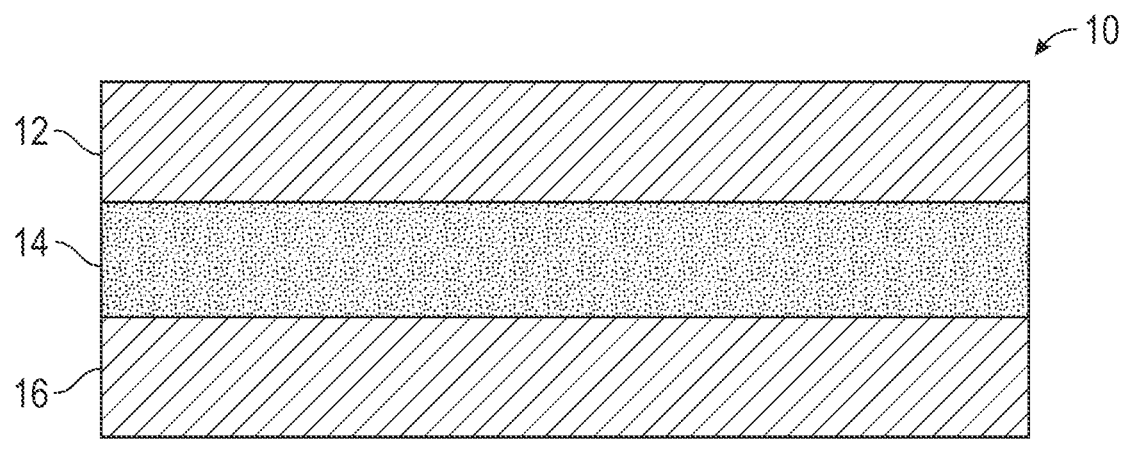
FIG. 8 depicts the effect of varied refractive indexes as employed by different embodiments disclosed herein.

Referring to FIG. 8, quantum dots in photoluminescent mode emit light isotropically (in all possible directions). In many applications it is desirable for the light produced by quantum dots to escape the matrix in which they are dispersed and travel in a preferred direction. The simplest structure to achieve some degree of directionality is to coat a layer of quantum dots in a polymer matrix on a film of material with a higher refractive index than the polymer matrix. With quantum dots dispersed in first material (20) with a lower refractive index (n1) than second material (22) with a refractive index (n2), and with an excitation source (24) coming from the side opposite second material (22) (i.e. through the first material 20), a percentage of light emitted isotropically from QDs in first material (20) will be refracted toward the normal line and will be preferentially emitted away from the excitation source compared to a situation where n1=n2. If a reflector is placed behind the excitation source then with each pass of reflected quantum dot light the quantum dot light will be directed toward the normal line, amplifying the directionality during each pass. If a sandwich is constructed with first material (20) having refractive index n1 layered between two second material (22) layers having refractive index n2, then the light is further directed toward the normal line with each pass.

Figure 9:
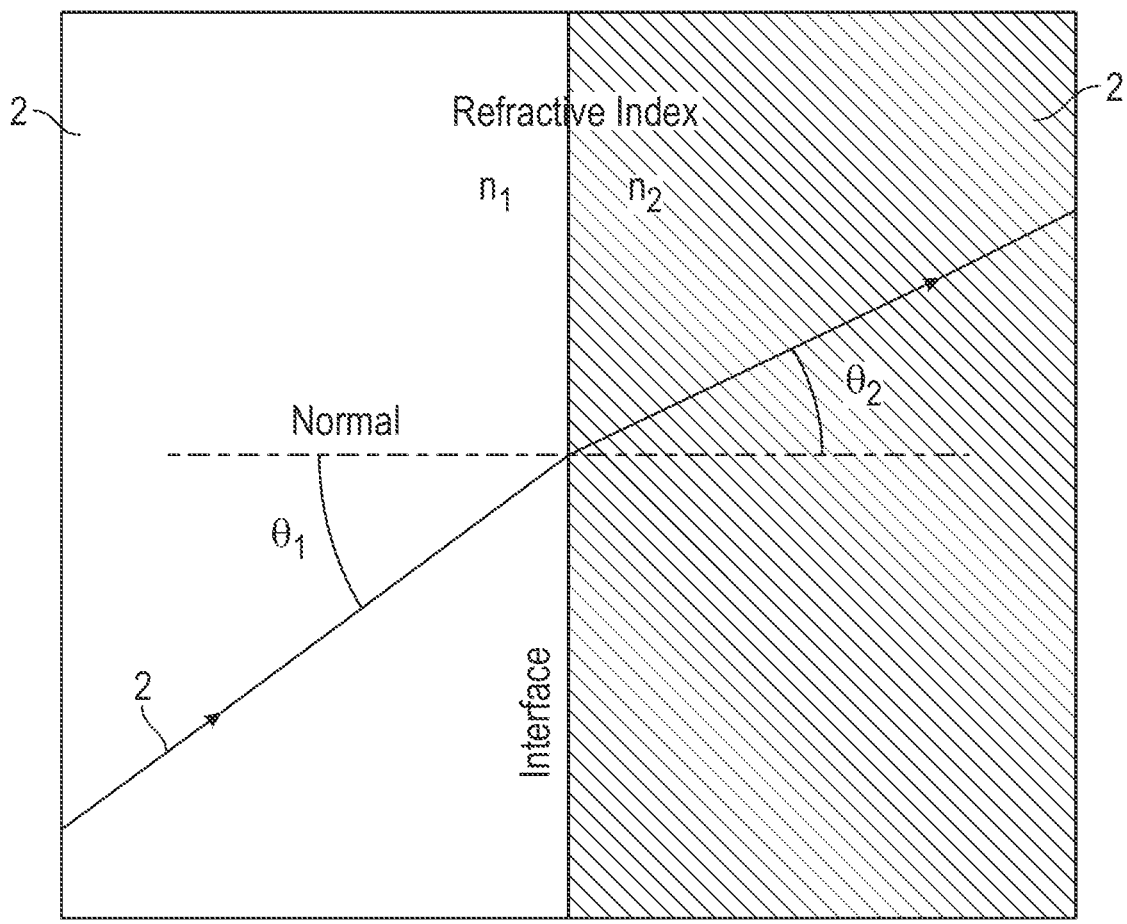
FIG. 9 depicts a multilayer film that includes multiple layers, including a film containing quantum dot cores in accordance with some embodiments.

Further embodiments are shown in FIG. 9, which shows multilayer film 50 that includes first layer 52 and last layer 56 and a middle layer 54 that includes a film containing capped or capped and passivated quantum dot cores as described above. First barrier layer 58 and second barrier layer 60 are situated between middle layer 54 and first layer 52 and middle layer 54 and last layer 56 respectively. In particular some embodiments, first layer 52 and last layer 56 can have a refractive index of from at least 1.47, in some cases at least 1.5 and in other cases at least 1.52 and can have a refractive index of up about 1.7, in some cases up to about 1.65 and in other cases up to about 1.6.

Generally, multilayer films and 3-D structures according to the invention as depicted in FIG. 9 can be made by first dispersing quantum dots in a suitable solvent and dissolving a acrylate resin, resin containing nitrogen monomers, and/or a resin made from acrylate monomers and nitrogen containing monomers into the quantum dot dispersion. The resulting dispersion is then coated onto a first barrier film, which is then dried. A second barrier film is then heat laminated over the dispersion coated surface of the first barrier film. Suitable first and last films and 3-D structures are then heat laminated over the first and second barrier films and 3-D structures.

In some embodiments, and referring to first layer 12 and last layer 16 in FIG. 7 and first layer 52 and last layer 56 in FIG. 9, the layers can be any suitable material independently selected from polyethylene, polycarbonate, polypropylene, modified cellulosic resins, clear polyvinyl chloride, acrylic resins, polysiloxanes, epoxy resins, Safire, quartz and glass.

In many embodiments of the films and 3-D structures and multilayer films and 3-D structures containing capped or capped and passivated 2-6-6 semiconductor nanocrystals as described above are advantageous compared to films and 3-D structures using crosslinked polymers as is often used in the art. The photostability of the resins used in the films and 3-D structures as described hereinabove provide quantum dots and films and 3-D structures containing quantum dots with improved photolytic stability.

In many embodiments of the films and 3-D structures the composite material is prepared by combining the nanocrystals with the polymer during or after polymerization in a suitable solvent, then removing the solvent to produce a material that consists of 95-100% solid material that is essentially solvent-free. This composite can then be injection molded, extruded, compression molded, transfer molded and pressed or formed using a process that first melts the composite and converts the composite into the desirable 3-D shape. These 3-D parts are then used in an optoelectronic device.

The quantum dots described herein may be included in solutions, inks, films, resin pellets, thermoplastic pellets.

Solutions containing the quantum dots described herein may be prepared simply by leaving the QDs in solution without drying or by placing purified QDs in a suitable solution for later use.

As described above, the QDs can be embedded in a polymer matrix to form films or 3-D structures. The composite (QD-matrix) can also be pelletized for later use as resin pellets or thermoplastic pellets which may then be used in subsequent molding processes, much as traditional resin or polymer pellets are used.

The QDs may be incorporated into an ink such as those suitable for ink jet printing, 3-D printing, or other printing techniques. The inks are generally prepared from the quantum dots as described herein mixed with polymer, such as the acrylate polymer described herein, and a solvent. Any suitable solvent, such as, but not limited to, toluene, may be used. Other additives useful in inks may also be employed, such as, but not limited to flow agents, self-leveling agents, viscosity modifiers, de-bubbling agents, binders, surfactants, etc. In some embodiments, the polymer and solvent components account for about 1 to about 80% of the ink composition. The quantum dots are present from about 0.1 mg to about 100 mg of quantum dots per gram of polymer.

The present invention will further be described by reference to the following examples. The following examples are merely illustrative and are not intended to be limiting. Unless otherwise indicated, all percentages are by weight unless otherwise specified.

EXAMPLES

Example A1-530 nm Cd-Free Quantum Dots 0.25 g of zinc acetate, 0.3 g of Indium Acetate, 0.01 g of copper acetate along with 5 ml of octadecane, 0.5 ml of octanoic acid, and 2 ml of 1-dodecanthiol were loaded into a three-neck flask. Without degassing, the temperature was increased to 270° C. The heat was removed after 10 minutes. The reaction provided. Cd-free quantum dots with an emission wavelength of about 530 nm.

Example A2-750 nm Cd-Free Quantum Dots 0.25 g of zinc acetate, 0.3 g of Indium Acetate, 0.05 g of copper acetate along with 5 ml of octadecane, 0.5 ml of Oleic acid, and 2 ml of 1-dodecanthiol were loaded into a three-neck flask. Without degassing, the temperature was increased to 270° C. The heat was removed after 10 minutes.

The reaction provided Cd-free ZnInCuS quantum dots with an emission wavelength of about 750 nm.

Examples A3-A7: Cd-Free N Quantum Dots with Emission Wavelengths Between 530 and 750 nm By changing the Zn/Cu ratio, the emission wavelength of the Cd-free quantum dots can be tuned to between 530 and 750 nm.

In examples 3 to 7, the reactions were carried out as in example 1, except the amount of Copper Acetate used was as indicated in Table 1, which shows the resulting emission spectrum for some of the wavelengths.

TABLE 1

| Example | Copper Acetate(g) | Emission Wavelength (nm) |
| --- | --- | --- |
| A3 | 0.015 | 540 |
| A4 | 0.018 | 560 |
| A5 | 0.025 | 600 |
| A6 | 0.035 | 660 |
| A7 | 0.045 | 720 |

Figure 10:
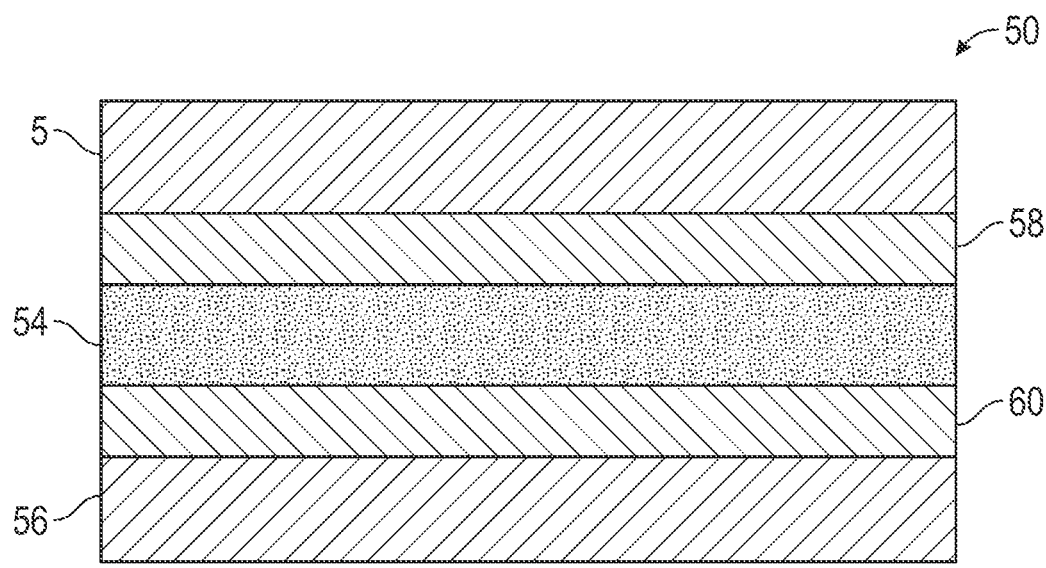
FIG. 10 is a chart showing the emission spectrum for exemplary Cd-Free quantum dots in accordance with some embodiments.

FIG. 10 shows the emission spectrum for some of the wavelengths.

Example A8 Capping with Method 1

In a glovebox, a solution was prepared for use in the deposition of one or more layers of ZnS onto the Cd-free nanocrystals of example 1. When no change in emission wavelength was observed of the Cd-free nanocrystals, the solution was injected slowly into the nanocrystal solution. This injection process lasted approximately two minutes.

The resultant solution was added to a 50 ml conical centrifuge tube and 5 ml hexanes and 15 ml of butanol were added. After sonication for about 1 minute, 20 ml methanol was added. The nanocrystals were centrifuged and the supernatant was discarded. The nanocrystals were washed two more times with 10 ml of hexanes, precipitated with 20 ml of methanol and re-centrifuged.

The purified nanocrystals were transferred to a three-neck round bottom flask and hexanes were removed by vacuum. Trioctylphosphine oxide (8.0 g) and stearic acid (0.2 g) were added. The flask was vacuum purged for 10 minutes and heated to 100° C. for 30 minutes and then to 200° C. for 30 minutes. The capping material was prepared in a glovebox as follows: 40 ul of dimethylzinc, 80 ul of hexamethyldisilathiane and 4 ml of trioctylphosphine were mixed in a glass vial and sealed with a robber stopper. The capping solution was put in a syringe, removed from the glovebox, and slowly injected into the core solution over at least 10 minutes. The resulting solution was stirred for 30 minutes at 200° C., then removed from heat and allowed to cool to room temperature.

This example provided capped Cd-free nanocrystals.

Example A9 Capping with Method 2

0.25 g of purified Cd-free cores from example 1 were placed in a three-neck flask with 1 g of Zinc Acetate. 0.032 g of S, 2 ml of 1-dodecanethiol, 1.0 ml of ODE and 2 ml of Octanoic acid. Degassing was conducted for 20 minutes, then the flask was filled with nitrogen, and the temperature raised to 240° C., and the reaction was allowed to progress for about 60 minutes.

This example provided capped Cd-free nanocrystals.

Example A10 Al$_2$O$_3$ Capping

In a glovebox, a solution was prepared for use in the deposition of one or more layers of ZnS onto the Cd-free nanocrystals of example 1. When no change in emission wavelength was observed of the Cd-free nanocrystals, the solution was injected slowly into the nanocrystal solution. This injection process lasted approximately two minutes.

The resultant solution was added to a 50 ml conical centrifuge tube and 5 ml hexanes and 15 ml of butanol were added. After sonication for about 1 minute, 20 ml methanol was added. The nanocrystals were centrifuged and the supernatant was discarded. The nanocrystals were washed two more times with 10 ml of hexanes, precipitated with 20 ml of methanol and re-centrifuged. The purified capped Cd-free nanocrystals were suspended in hexanes for further capping.

The purified nanocrystals were transferred to a three-neck round bottom flask and hexanes were removed by vacuum. Trioctylphosphine oxide (8.0 g) and stearic acid (0.2 g) were added. The flask was vacuum purged for 10 minutes and heated to 100° C. for 30 minutes and then to 200° C. for 30 minutes. The capping material was prepared in a glovebox as follows: 40 ul of dimethylzinc, 80 ul of hexamethyldisilathiane and 4 ml of trioctylphosphine were mixed in a glass vial and sealed with a robber stopper. The capping solution was put in a syringe, removed from the glovebox, and slowly injected into the core solution over at least 10 minutes. The resulting solution was stirred for 30 minutes at 200° C., then removed from heat and allowed to cool to room temperature.

Several monolayers of aluminum were grown on the capped Cd-free nanocrystals as follows. The aluminum capping materials were prepared in a glovebox by mixing 10 ul of trimethylaluminum and 1 ml of trioctylphosphine to form a capping solution and sealed with robber stopper. The capping solution was put in a syringe, removed from the glovebox, and slowly injected into the core/shell nanocrystal solution over about 5 minutes at 200° C. then removed from the heat and allow to cool to 100° C., at which point the flask was opened to air, which allowed the aluminum outer coating on the core/shell nanocrystals to slowly oxidize over 3 hours at 100° C. Several monolayers of Al$_2$O$_3$ were coated on the core/shell nanocrystals providing passivated core/shell Cd-free nanocrystals.

Example A11-ZnCuGaS 0.25 g of zinc acetate, 0.3 g of Gallium Acetate, 0.01 g of copper acetate along with 5 ml of octadecane, 0.5 ml of Octanoic acid, and 2 ml of 1-dodecanthiol were loaded into a three flask. Without degassing, the temperature was increases to 270° C. The heat was removed after 10 minutes.

This example provided Cd-free quantum dots with emission wavelength around 550 nm.

Example A12-ZnCuAlS 0.25 g of zinc acetate. 0.3 g of Aluminum Acetate, 0.01 g of copper acetate along with 5 ml of octadecane, 0.5 ml of Octanoic acid, and 2 ml of 1-dodecanthiol were loaded into a three flask. Without degassing, the temperature was increased to 270° C., The heat was removed after 10 minutes.

This example provided Cd-free quantum dots with emission wavelength around 490 nm.

Example A13 ZnCuInSSe 0.25 g of zinc acetate. 0.3 g of Indium Acetate, 0.01 g of copper acetate along with 5 ml of octadecane, 0.5 ml of Octanoic acid, 200 ul of TBP/Se solution (concentration was 1 g/10 ml) and 2 ml of 1-dodecanthiol were loaded into a three flask. Without degassing, the temperature was increased to 270° C. The heat was removed after 10 minutes.

This example provided Cd-free quantum dots with emission wavelength around 550 nm.

Example A14-ZnCuInGaS 0.25 g of zinc acetate, 0.3 g of Indium Acetate, 0.1 g of Gallium Acetate, 0.01 g of copper acetate alone with 5 ml of octadecane, 0.5 ml of Octanoic acid, and 2 ml of 1-dodecanthiol were loaded into a three flask, Without degassing, the temperature was increased to 270° C. The heat was removed after 10 minutes.

This example provided Cd-free quantum dots with emission wavelength around 560 nm.

Example A15-ZnCuInGaSSe 0.25 g of zinc acetate, 0.3 g of Indium Acetate, 0.1 g of Gallium Acetate, 0.01 g of copper acetate along with 5 ml of octadecane, 0.5 ml of Octanoic acid, 200 ul of TBP/Se solution (concentration was 1 g/10 ml) and 2 ml of 1-dodecanthiol were loaded into a three flask. Without degassing, the temperature was increased to 270° C. The heat was removed after 10 minutes.

This example provided Cd-free quantum dots with emission wavelength around 560 nm.

Example A16-ZnCuInAlS 0.25 g of zinc acetate, 0.3 g of Indium Acetate, 0.1 g of Aluminum Acetate, 0.01 g of copper acetate along with 5 ml of octadecane, 0.5 ml of Octanoic acid, and 2 ml of 1-dodecanthiol were loaded into a three flask. Without degassing, the temperature was increased to 270° C. The heat was removed after 10 minutes.

This example provided quantum dots with emission wavelength around 500 nm.

Example A17-ZnCuInAlSSe 0.25 g of zinc acetate, 0.3 g of Indium Acetate, 0.1 g of Aluminum Acetate, 0.01 g of copper acetate along with 5 ml of octadecane, 0.5 ml of Octanoic acid, 200 ul of TBP/Se solution (concentration was 1 g/10 ml) and 2 ml of 1-dodecanthiol were loaded into a three flask. Without degassing, the temperature was increased to 270° C. The heat was removed after 10 minutes.

This example provided quantum dots with emission wavelength around 540 nm.

Example A18-ZnCuGaAlS 0.25 g of zinc acetate, 0.3 g, of Gallium Acetate, 0.1 g of Aluminum Acetate, 0.01 g of copper acetate along with 5 ml of octadecane, 0.5 ml of Octanoic acid, and 2 ml of 1-dodecanthiol were loaded into a three flask. Without degassing, the temperature was increased to 270° C. The heat was removed after 10 minutes.

This example provided quantum dots with emission wavelength around 500 nm.

Example A19-ZnCuGaAlSSe 0.25 g of zinc acetate, 0.3 g of Gallium Acetate, 0.1 g of Aluminum Acetate, 0.01 g of copper acetate along with 5 ml, of octadecane, 0.5 ml of Octanoic acid, 200 ul of TBP/Se solution (concentration was 1 g/10 ml) and 2 ml of 1-dodecanthiol were loaded into a three flask. Without degassing, the temperature was increased to 270° C. The heat was removed after 10 minutes.

This example provided quantum dots with emission wavelength around 540 nm.

Example B1: pH Controller Tuned Qds

Core Synthesis

Zinc Acetate (0.2 g)(as pH controller), octadecene (80 mL) was mixed with oleic acid (4 ml) and added to CdO (0.512 g) in a three neck round bottom flask. The flask was flushed with 99.999% nitrogen for 20 minutes and then heated to 300° C. until the solution was clear. Stock solutions of selenium and sulfur were prepared in a glove box under 99.999% nitrogen. Selenium powder (1.00 vas mixed with tributylphosphine 0.00 mL) and sulfur powder (0.050 g) was mixed with octadecene (20.00 mL). 200 μL selenium precursors were mixed with 20 mL sulfur precursors in a 20 mL glass vial, diluted to 2.00 mL with octadecene, and then added to the cadmium precursors via a syringe and stirred for 60 minutes, or until no change in emission wavelength is observed. This produces cores that fluoresce at 570 nm.

Examples B2-B6

The same procedure for Example B1 was conducted for examples B2-B6, except the amount of Zinc Acetate, as pH controller, in the core synthesis was changed as indicated in the table below.

| Example | Zinc Acetate(g) | Emission maximum (nm) |
| --- | --- | --- |
| B1 | 0.20 | 570 |
| B2 | 0.25 | 590 |
| B3 | 0.30 | 600 |
| B4 | 0.40 | 640 |
| B5 | 0.50 | 660 |
| B6 | 0.70 | 680 |

Figure 12:
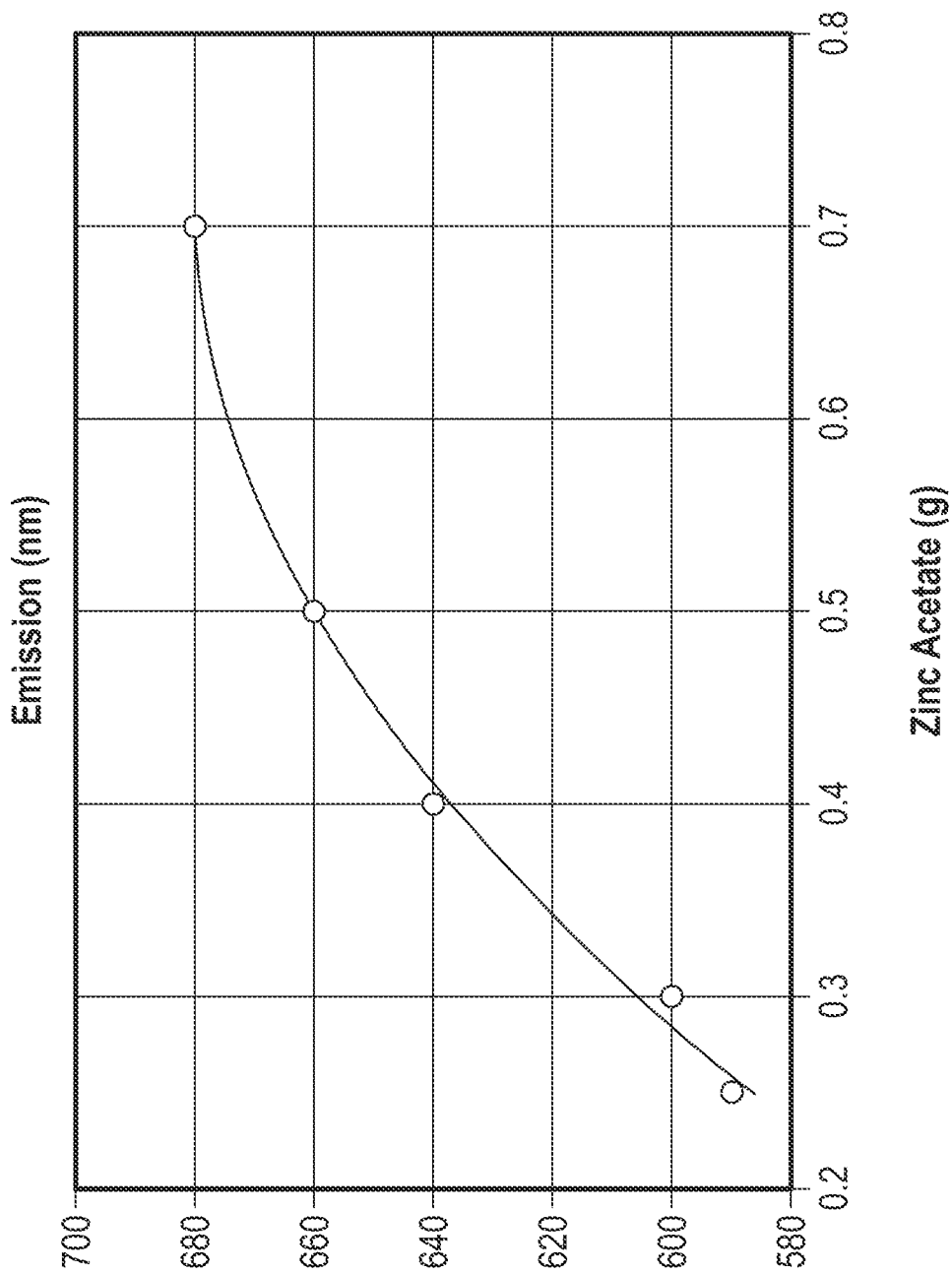
FIG. 12 is a calibration curve developed from the data associated with examples B1 through B6 disclosed herein.

This data can be graphed to provide a calibration curve to determine the proper amount of Zinc Acetate for the desired wavelength by plotting emission maximum on the Y-axis and Zinc Acetate on the X-axis. A calibration curve based on this data is shown in FIG. 12.

Examples B7-B11

The same procedure for Example B1 was conducted to produce the cores for examples B7-B11. The cores were then subjected to purification and capping.

Purification

The entire core solution was added to 80 mL of hexanes and 180 mL of butanol. The resultant solution was centrifuged (2,680 G for 5 minutes) and the supernatant was discarded leaving nanocrystals. The nanocrystals were washed three times by being suspended in hexanes (10 mL), precipitated with methanol (30 mL) and centrifuged (2,680 G for 10 minutes). The crystals were then suspended in 5 mL hexanes.

Capping

The purified nanocrystals were transferred to a three neck round bottom flask and the solvent (hexanes) removed by vacuum. Zinc Acetate (see table below), octadecene (20 ml) and Oleic acid (10 ml) were added to the flask. The flask was vacuum purged for 10 minutes and then heated to 100° C. for 30 minutes and then to 200° C. for another 30 minutes. While the nanocrystals were heating, the capping solution was prepared in a glove box as follows:

Dimethyl zinc (40 μL) was mixed with hexamethyldisilathiane (80 μL, CAS #3385-94-2) and trioctylphosphine (2.00 mL). The capping solution was put in a syringe, removed from the glovebox, and added to the nanocrystals drop-by-drop over five minutes. The resulting solution was stirred for two hours at 200° C. and then allowed to cool to room temperature.

The amount of Zinc Acetate (pH controller) was changed in the capping step as indicated in the table below. The red shift after capping indicates the longer the red shift, the thicker the shell. A thicker shell nanocrystal can increase the photo and chemical stability.

| Example | Zinc Acetate(g) | Emission maximum red shift (nm) |
| --- | --- | --- |
| B7 | 0.00 | 4 |
| B8 | 0.10 | 6 |
| B9 | 0.20 | 8 |
| B10 | 0.40 | 10 |
| B11 | 0.70 | 11 |

Figure 13:
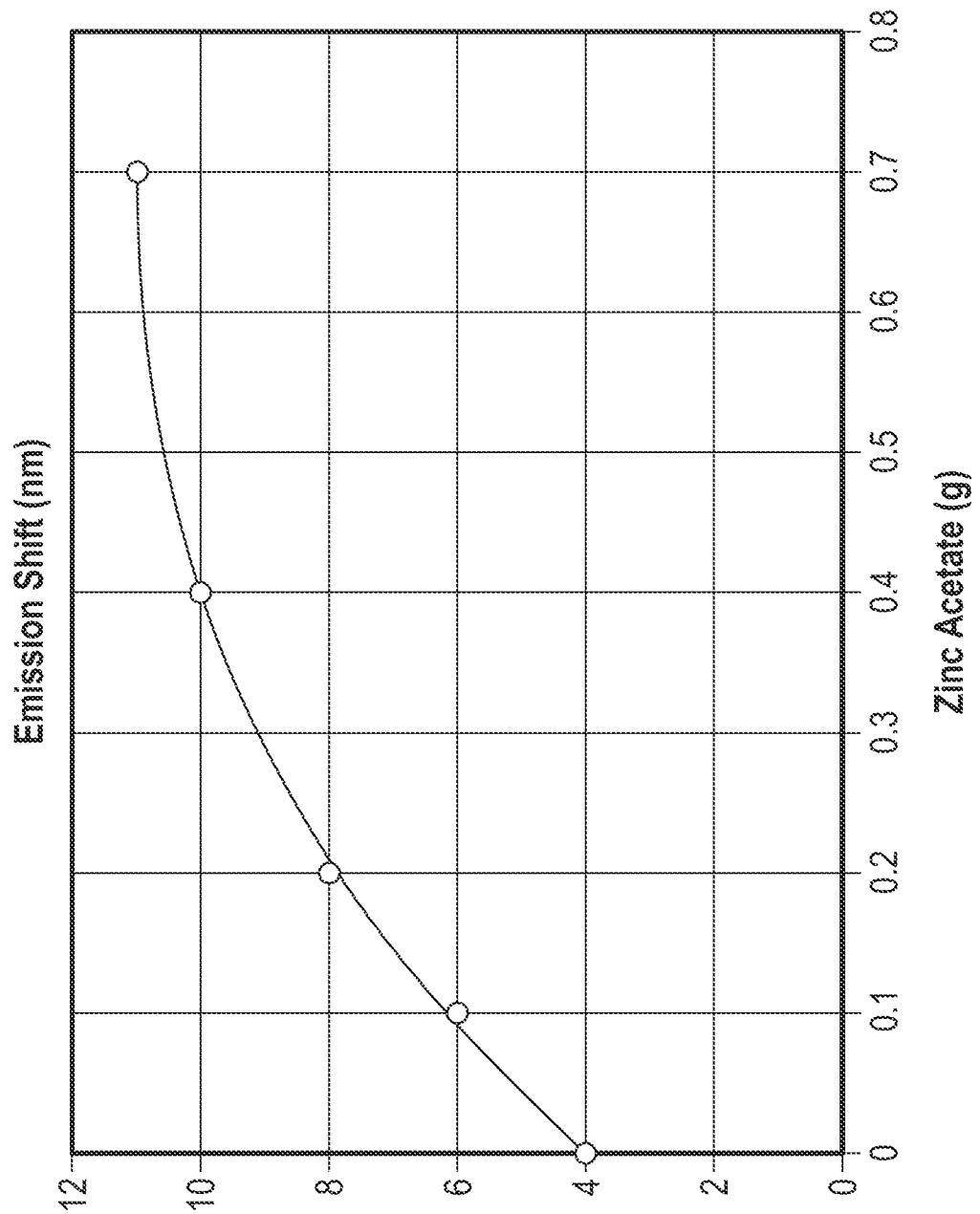
FIG. 13 is a calibration curve developed from the data associated with examples B7 through B11 disclosed herein.

A calibration curve for the shift in emission wavelength based on this data is shown in FIG. 13.

Example B12 (Comparative)

CdZnSSe nanocrystals were fabricated as follows. To a 100 ml three-neck round bottom flask, 0.16 mmol of CdO, 0.4 mmol of Zn(AC)2, 200 µl of oleic acid and 8 ml of octadecene were added. The flask was connected to a vacuum and degassed for about 10 minutes, then filled with high purity nitrogen, heated up to 300° C., and stirred until a colorless solution was formed. Stock solution of sulfur and selenium were prepared in a glovebox filled with 99.999% nitrogen. Selenium powder (1.00 g) was mixed with tributylphosphine (1000 ml) and sulfur powder (0.05 g) was mixed with octadecene (25.00 ml). An amount of the above sulfur and selenium stock solutions were mixed together in a glass vial and diluted with octadecene up to 4 ml resulting in a solution herein called an injection solution. The amount of sulfur and selenium was 1 mmol in total, the S to Se ratio was determined by the final emission wavelength of the derived nanocrystals. The injection solution was removed from the glovebox using a syringe and injected into the Cd and Zn precursor solution quickly while the growth temperature was raised to 270° C. This temperature was maintained for 40 to 60 minutes to allow the nanocrystals to grow to the desired size as determined by the desired emission wavelength.

In the glovebox, a solution was prepared for use in the deposition of one or more layers of ZnS onto the prepared nanocrystals. When no change in emission wavelength was observed of the above-prepared nanocrystals, the solution was injected slowly into the nanocrystal solution. This injection process lasted approximately two minutes.

The resultant solution was added to a 50 ml conical centrifuge tube and 5 ml hexanes and 15 ml of butanol were added. After sonication for about 1 minute, 20 ml methanol was added. The nanocrystals were centrifuged and the supernatant was discarded. The nanocrystals were washed two more times with 10 ml of hexanes, precipitated with 20 ml of methanol and re-centrifuged. The purified nanocrystals were suspended in hexanes for further capping.

The purified nanocrystals were transferred to a three-neck round bottom flask and hexanes were removed by vacuum. Trioctylphosphine oxide (8.0 g) and stearic acid (0.2 g) were added. The flask was vacuum purged for 10 minutes and heated to 100° C. for 30 minutes and then to 200° C. for 30 minutes. Capping material was prepared in a glovebox as follows: 40 ul of dimethylzinc, 80 ul of hexamethyldisilathiane and 4 ml of trioctylphosphine were mixed in a glass vial and sealed with a robber stopper. The capping solution was put in a syringe, removed from the glovebox, and slowly injected into the core solution over at least 10 minutes. The resulting solution was stirred for 30 minutes at 200° C., then removed from heat and allowed to cool to room temperature.

Examples B13 and B14

Figure 11:
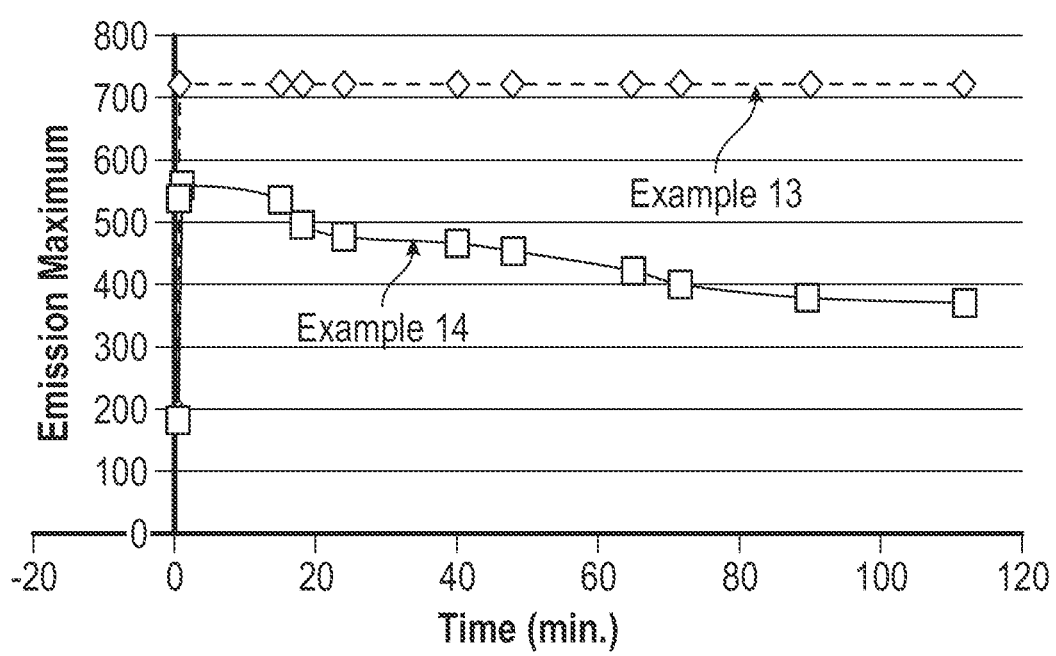
FIG. 11 is a graph comparing stability testing of examples B13 and B15 disclosed herein.

To compare the photo stability of the nanocrystals made in this invention, a nanocrystal—polymethylmethacrylate (PMMA) film was deposited and illuminated by an ultra-intense blue (450 nm) LED to monitor the intensity decay. Films were prepared by dispersing the nanocrystals in a toluene solution of PMMA using a Brinkman Homogenizer and then coating films using an Elcometer 4340 Automatic Film Applicator and allowing the films to dry at room temperature. In this way, the nanocrystals (5 mg), from example B11 and example B12, were added to PMMA (5 g) to make a thin film. Under ultra-intense blue (450 nm) LED for continuous illumination. FIG. 11 shows the stability testing result (Example B13 contains the nanocrystals from example B11 and Example B14 contains the nanocrystals from Example B12. The data demonstrate the photostability of the nanocrystals made according to the invention.

As can be seen, the film using nanocrystals according got Example B11 in a PMMA film maintains emission for at least 120 minutes while the comparative nanocrystals of Example B12 in a PMMA film drop significantly, even after only 20 minutes.

Examples B15-B20

Polymers were synthesis via free radical polymerization in toluene. Vinyl-based monomers (as indicated in the table below, where weight ratios of comonomers are indicated) with varied amounts were used in the polymerization. Monomer(s) was (were) dissolved in toluene (1 mL to 1 g of monomers). The initiator, azobisisobutyronitrile (AIBN, 0.5 wt % to monomers), was added. The mixture was purged with N2 for 30 min. The mixture was then heated to 70° C. and stirred overnight. The resulting product was colorless viscous liquid. MMA=methyl methacrylate, BA=butyl acrylate, CHA=cyclohexyl acrylate, NNDMT=Formula V where R3 and R4 are both methyl. Mw and PDI values were determined by GPC using analytical standards.

| Ex. No. | Monomer(s) | $M_w$ (Kg/mol) | PDI | $T_g$ (° C.) | Toluene Solution |
| --- | --- | --- | --- | --- | --- |
| B15 | 80/20 MMA/BA | 51 | 1.7 | 65 | transparent |
| B16 | 90/10 MMA/BA | 50 | 1.7 | 93 | transparent |
| B17 | 95/5 MMA/BA | 39 | 1.7 | 110 | transparent |
| B18 | 60/40 MMA/BA | 108 | 2.3 | | Phase separated |
| B19 | 100 CHA | | | 100 | transparent |
| B20 | 100 NNDMT | | | 19-30 | transparent |

Cast films were prepared by dispersing the nanocrystals of Example B11 in a toluene solution of the polymers in Examples B15-B20 using a Brinkman Homogenizer and then casting films using an Elcometer 4340 Automatic Film Applicator and allowing the films to dry at room temperature as was described in Examples B13 and B14. All made acceptable films with improved stability as demonstrated in Example B13, except for Example B18.

Extruded films were prepared by dispersing the nanocrystals of Example B11 in a toluene solution of the polymers in Examples B15-B20 using a Brinkman Homogenizer and then removing the toluene in a vacuum oven at 125° C. and 30 mm Hg vacuum. The resulting material was then melted in a heated tube to 175° C. and extruded onto a glass slide and allowed to cool forming a composite containing a concentration of 0.5 mg of nanocrystals per 1000 mg of polymer.

Example B21

Passivated CdZnSSe nanocrystals were fabricated as follows. To a 100 ml three-neck round bottom flask, 0.16 mmol of CdO, 0.4 mmol of Zn(AC)2, 200 μl of oleic acid and 8 ml of octadecene were added. The flask was connected to a vacuum and degassed for about 10 minutes, then filled with high purity nitrogen, heated up to 300° C., and stirred until a colorless solution was formed. Stock solution of sulfur and selenium were prepared in a glovebox filled with 99.999% nitrogen. Selenium powder (1.00 g) was mixed with tributylphosphine (10.00 ml) and sulfur powder (0.05 g) was mixed with octadecene (25.00 ml). An amount of the above sulfur and selenium stock solutions were mixed together in a glass vial and diluted with octadecene up to 4 ml resulting in a solution herein called an injection solution. The amount of sulfur and selenium was 1 mmol in total, the S to Se ratio was determined by the final emission wavelength of the derived nanocrystals. The injection solution was removed from the glovebox using a syringe and injected into the Cd and Zn precursor solution quickly while the growth temperature was raised to 270° C. This temperature was maintained for 40 to 60 minutes to allow the nanocrystals to grow to the desired size as determined by the desired emission wavelength.

In the glovebox, a solution was prepared for use in the deposition of one or more layers of ZnS onto the prepared nanocrystals. When no change in emission wavelength was observed of the above-prepared nanocrystals, the solution was injected slowly into the nanocrystal solution. This injection process lasted approximately two minutes.

The resultant solution was added to a 50 ml conical centrifuge tube and 5 ml hexanes and 15 ml of butanol were added. After sonication for about 1 minute. 20 ml methanol was added. The nanocrystals were centrifuged and the supernatant was discarded. The nanocrystals were washed two more times with 10 ml of hexanes, precipitated with 20 ml of methanol and re-centrifuged. The purified nanocrystals were suspended in hexanes for further capping.

The purified nanocrystals were transferred to a three-neck round bottom flask and hexanes were removed by vacuum. Trioctylphosphine oxide (8.0 g) and stearic acid (0.2 g) were added. The flask was vacuum purged for 10 minutes and heated to 100° C. for 30 minutes and then to 200° C. for 30 minutes. Capping material was prepared in a glovebox as follows: 40 ul of dimethylzinc, 80 ul of hexamethyldisilathiane and 4 ml of trioctylphosphine were mixed in a glass vial and sealed with a robber stopper. The capping solution was put in a syringe, removed from the glovebox, and slowly injected into the core solution over at least 10 minutes. The resulting solution was stirred for 30 minutes at 200° C., then removed from heat and allowed to cool to room temperature.

Several monolayers of aluminum were grown on the nanocrystals as follows. The aluminum capping materials were prepared in a glovebox by mixing 10 ul of trimethylaluminum and 1 ml of trioctylphosphine to form a capping solution and sealed with robber stopper. The capping solution was put in a syringe, removed from the glovebox, and slowly injected into the core/shell nanocrystal solution over about 5 minutes at 220° C. then removed from the heat and allow to cool to 100° C., at which point the flask was opened to air, which allowed the aluminum outer coating on the core/shell nanocrystals to slowly oxidize over one hour at 100° C. Several monolayers of Al2O3 were coated on the core/shell nanocrystals providing passivated core/shell nanocrystals.

Example B22

A solution cast film containing the passivated nanocrystals of Example B2.1 was prepared as follows: The passivated nanocrystals of Example 16 were added to a 50/50 w/w solution of cyclohexylacrylate homopolymer and toluene. The Mw of the polymer was approximately 125,000. The passivated nanocrystals were added at a concentration of 0.5 mg nanocrystals per gram of polymer. The mixture was then mixed for 2 minutes with a high-shear mixer (Brinkman, Model #PT/35). The mixture was them dried on a glass slide to a thickness of 0.5 mm.

Figure 14:
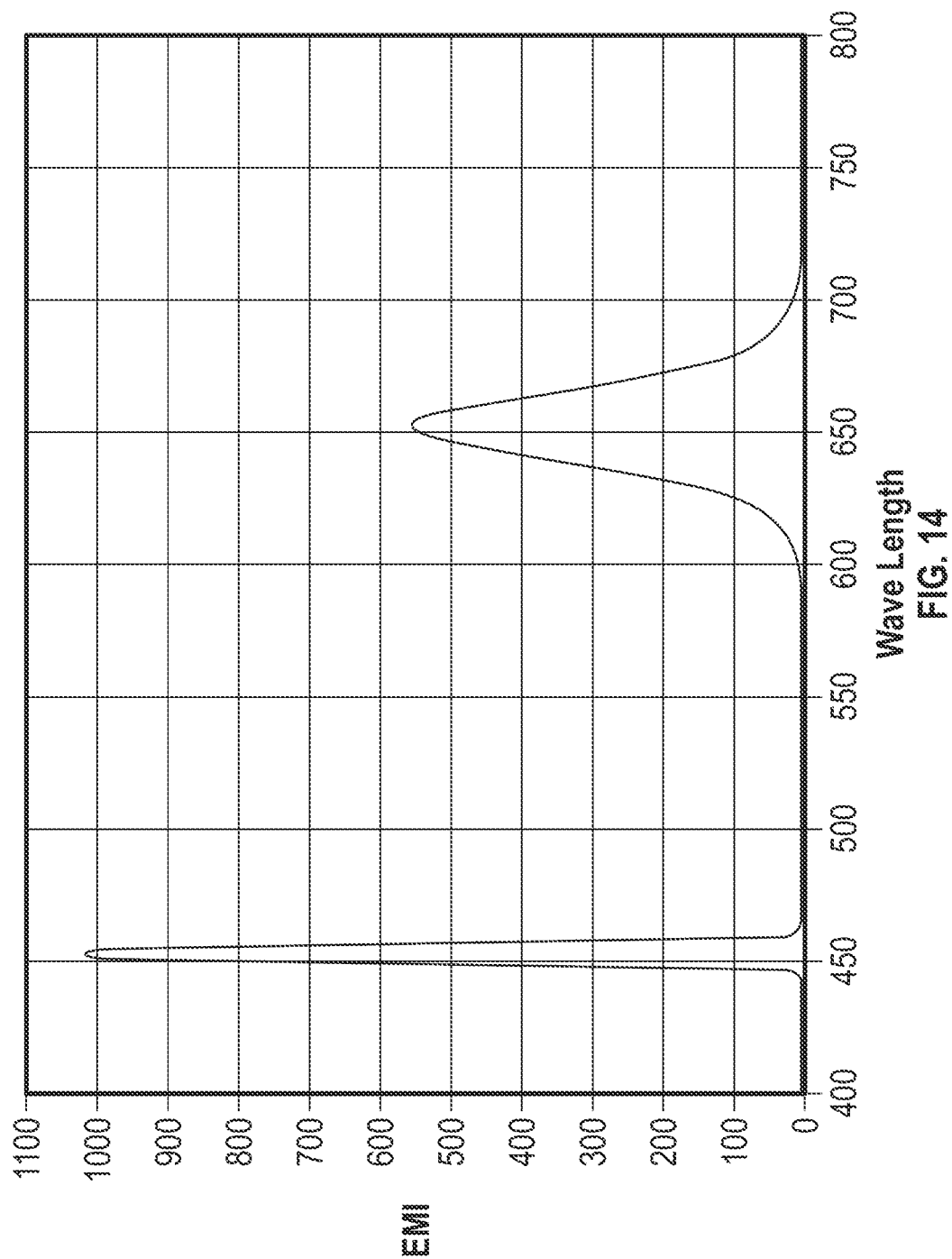
FIG. 14 is an emission spectra of the solvent cast film of example B22 made using excitation at 450 nm and the emission in the red wavelengths of the spectra.

FIG. 14 shows an emission spectra of the solvent cast film made using excitation at 450 nm and the emission in the red wavelengths of the spectra.

Example B23

A melt extruded film containing the passivated nanocrystals of Example B21 was prepared as follows: The passivated nanocrystals of Example B21 were added to a 50/50 w/w solution of cyclohexylacrylate homopolymer (Mw about 125,000) in toluene. The mixture was then homogenized for 2 minutes with a high-shear mixer (Brinkman. Model #PT/35). The homogenized mixture was dried to form a nanocrystal/polymer composite material, which was ground into 1-5 mm chips and loaded into a glass syringe and heated to 175° C. The molten mixture was then extruded onto a glass slide at a thickness of 0.5 mm.

Figure 15:
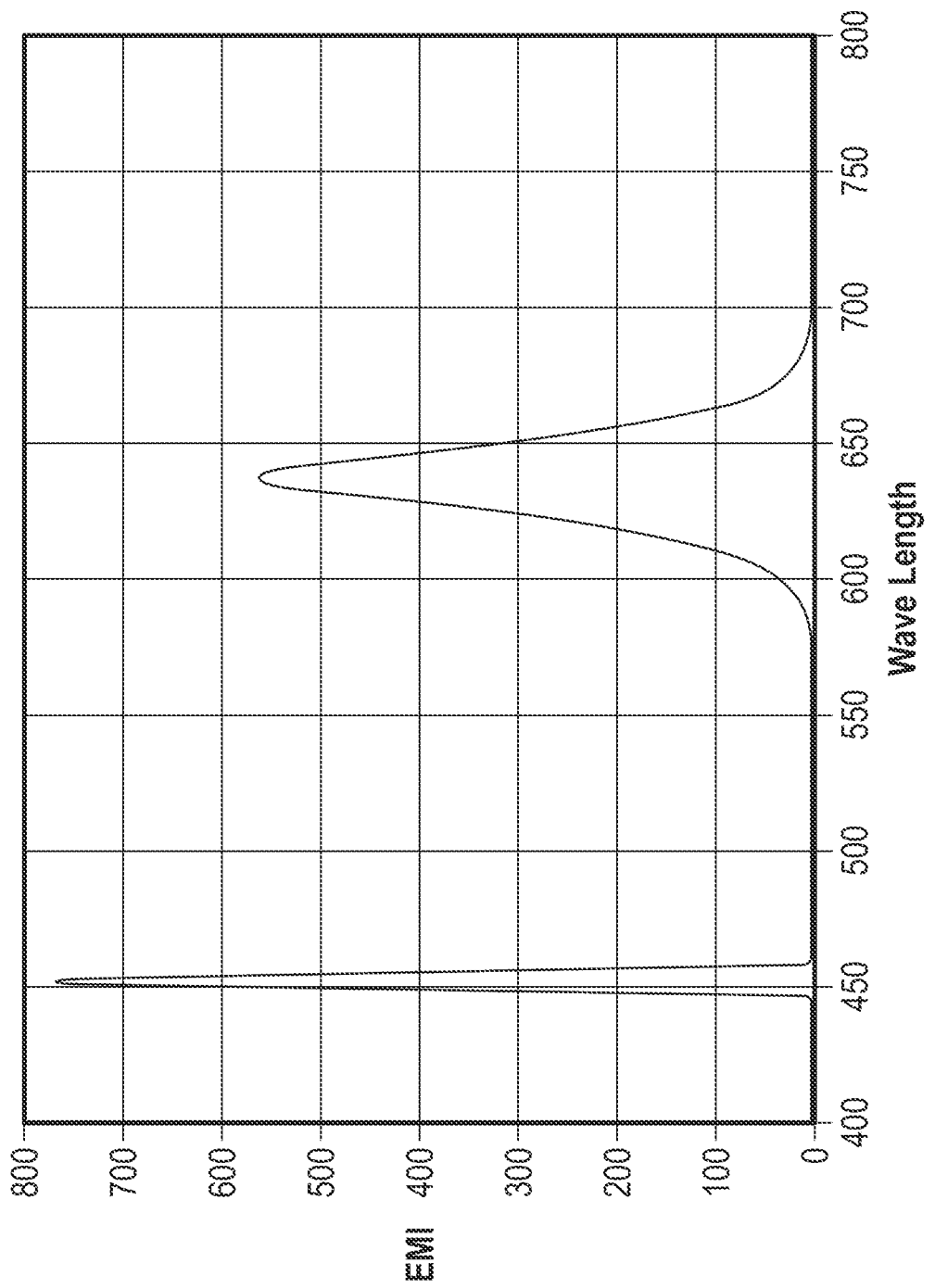
FIG. 15 is an emission spectra of the melt extruded film of example B23 made using excitation at 450 nm and the emission in the red wavelengths of the spectra.

FIG. 15 shows an emission spectra of the melt extruded film made using excitation at 450 nm and the emission in the red wavelengths of the spectra.

The present invention has been described with reference to certain details of particular embodiments thereof it is not intended that such details be regarded as limitations upon the scope of the invention except insofar as and to the extent that they are included in the accompanying claims.

Thermoset Example: An example of a thermoset acrylic formula that cures in the presence of QDs is as follows: heptyl acrylate 60% (weight), cyclohexyl acrylate 30%, trimethylolpropane triacrylate (TMPTA) 10%. To this is added a thermal initiator such as benzoyl peroxide at 0.1% and QDs in the range of 0.001-20% wt/wt. The mixture is polymerized by heating to 85 deg C. for 10 min.

It is contemplated herein that any quantum dot can be subjected to the capping and passivation methods disclosed herein and further incorporated into a polymer matrix as described herein. The fact that the disclosure or examples above are directed to specific combinations of particular quantum dot types, particular capping, particular passivation layers, and a particular polymers is not meant to suggest that this disclosure is limited to those particular combinations. The disclosure is exemplary, and not limiting, in nature. Those of skill in the art will recognize variations of the theme without departing from the scope and spirit of this disclosure.

What is claimed is:

1. A nanocrystal polymer composite comprising a plurality of capped ZnInCuS semiconductor nanocrystals dispersed in a polymer resin, wherein,
    the capped ZnInCuS semiconductor nanocrystals comprise:
        a core comprising ZnInCuS, wherein the core is modified with a zinc alkylcarboxylate or a dialkyl zinc;
        a first cap layer overlying the core, wherein the first cap layer comprises ZnS;
        a second cap layer overlying the first cap layer, wherein the second cap layer comprises $Al_2O_3$;
        the capped ZnInCuS semiconductor nanocrystals are configured to emit radiation in a range from 530 nm to 750 nm; and the polymer resin comprises an acrylate resin, wherein the acrylate resin is derived from homopolymers of cyclohexyl acrylate and cyclohexyl acrylate copolymer with methyl methacrylate or heptyl acrylate.

2. The nanocrystal polymer composite of claim 1, wherein the acrylate resin comprises from 25 wt % to 100 wt % of cyclohexyl acrylate, wherein wt % is based on the total weight of the acrylate resin.

3. The nanocrystal polymer composite of claim 1, wherein the acrylate resin is derived from heptyl acrylate, cyclohexyl acrylate, and trimethylolpropane triacrylate.

4. The nanocrystal polymer composite of claim 1, wherein the polymer resin is derived from a nitrogen-containing monomer, wherein the nitrogen-containing monomer comprises a nitrogen-containing monomer having the structure of Formula (II), Formula (III), Formula (IV), Formula (V), or a combination of any of the foregoing:

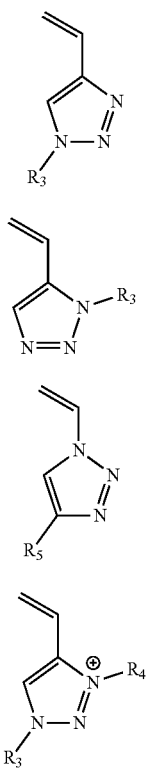

wherein,
each of $R^3$ and $R^4$ is independently selected from methyl, ethyl, propyl, isopropyl, butyl, isobutyl, pentyl, cyclopentyl, iso-pentyl, $C_6$ to $C_{12}$ linear, branched, cyclic or aromatic hydrocarbyl, and polyethylene glycol; and $R^5$ is selected from hydrogen, methyl, ethyl, propyl, isopropyl, butyl, isobutyl, pentyl, cyclopentyl, iso-pentyl, $C_6$ to $C_{12}$ linear, branched, cyclic or aromatic hydrocarbyl, and polyethylene glycol.

5. The nanocrystal polymer composite of claim 1, wherein the core is modified with a zinc alkyl carboxylate.

6. The nanocrystal polymer composite of claim 1, wherein the core is modified with a dialkyl zinc.

7. The nanocrystal polymer composite of claim 1, wherein a bond dissociation energy between the polymer resin and the $Al_2O_3$ layer is greater than the energy required to reach the melt temperature of the polymer resin when cross-linked.

8. The nanocrystal polymer composite of claim 1, wherein the nanocrystal polymer composite comprises from 0.0001 wt % to 75 wt % of the capped ZnInCuS semiconductor nanocrystals, wherein wt % is based on the total weight of the nanocrystal polymer composite.

9. The nanocrystal polymer composite of claim 1, wherein the nanocrystal polymer composite is cured.

10. The nanocrystal polymer composite of claim 1, wherein the nanocrystal polymer composite is uncured.

11. The nanocrystal polymer composite of claim 1, wherein the nanocrystal polymer composite comprises a down conversion film.

12. The nanocrystal polymer composite of claim 1, wherein the nanocrystal polymer composite comprises a three-dimensional structure.

13. The nanocrystal polymer composite of claim 1, wherein the nanocrystal polymer composite comprises a solution, an ink, a film, a resin pellet, or a thermoplastic pellet.

14. An optical device comprising the nanocrystal polymer composite of claim 1.

15. An optoelectronic device comprising the nanocrystal polymer composite of claim 1.

16. The nanocrystal polymer composite of claim 1, wherein the polymer resin is derived from homopolymers of cyclohexyl acrylate and cyclohexyl acrylate copolymers with methyl methacrylate or heptyl acrylate, wherein the homopolymers and copolymers comprise repeating carbonyl units oriented in three-dimensional space such that the electronegative carbonyl oxygen repeat distance matches a repeat distance of electropositive regions on a surface of the $Al_2O_3$ cap layer.

17. The nanocrystal composite of claim 1, wherein the zinc alkylcarboxylate is zinc acetate.

18. The nanocrystal composite of claim 1, wherein the dialkyl zinc is dimethyl zinc.

* * * * *